(12) United States Patent
Weng et al.

(10) Patent No.: US 11,990,891 B2
(45) Date of Patent: May 21, 2024

(54) SURFACE ACOUSTIC WAVE RESONATOR STRUCTURE AND METHOD OF FORMING THE SAME, AND FILTER

(71) Applicant: Shenzhen Newsonic Technologies Co., Ltd., Guangdong (CN)

(72) Inventors: Guojun Weng, Guangdong (CN); Gongbin Tang, Guangdong (CN); Jingyong Liu, Guangdong (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/130,504

(22) Filed: Apr. 4, 2023

(65) Prior Publication Data
US 2023/0299740 A1  Sep. 21, 2023

(30) Foreign Application Priority Data
Oct. 8, 2022  (CN) .......................... 202211219108.0

(51) Int. Cl.
| | |
|---|---|
| H03H 9/25 | (2006.01) |
| H03H 3/08 | (2006.01) |
| H03H 9/02 | (2006.01) |
| H03H 9/64 | (2006.01) |

(52) U.S. Cl.
CPC ............... *H03H 9/25* (2013.01); *H03H 3/08* (2013.01); *H03H 9/02834* (2013.01); *H03H 9/64* (2013.01)

(58) Field of Classification Search
CPC ............. H03H 9/25; H03H 9/145; H03H 9/64
See application file for complete search history.

(56) References Cited

U.S. PATENT DOCUMENTS

| | | | | |
|---|---|---|---|---|
| 9,973,169 | B2 * | 5/2018 | Steiner | ................ H03H 9/6489 |
| 10,469,050 | B2 * | 11/2019 | Gamble | ............ H03H 9/02015 |
| 10,797,679 | B2 * | 10/2020 | Horikawa | .......... H03H 9/14541 |

(Continued)

FOREIGN PATENT DOCUMENTS

| | | |
|---|---|---|
| CN | 112886938 A | 6/2021 |
| CN | 113452342 A | 9/2021 |

(Continued)

*Primary Examiner* — Andrea Lindgren Baltzell
*Assistant Examiner* — Alan Wong
(74) *Attorney, Agent, or Firm* — Leason Ellis LLP

(57) ABSTRACT

A surface acoustic wave resonator structure and a method of forming the resonator structure and a filter are provided. The resonator structure includes: a piezoelectric substrate; an interdigital transducer including a first interdigital electrode structure and a second interdigital electrode structure, wherein the first interdigital electrode structure comprises first interdigital electrodes and a first interdigital electrode lead-out part connected to each other, the second interdigital electrode structure comprises second interdigital electrodes and a second interdigital electrode lead-out part connected to each other, the first interdigital electrodes and the second interdigital electrodes extend along a first direction and are alternately arranged in a second direction; a temperature compensation layer, disposed on a side of the interdigital transducer away from the piezoelectric substrate; and a first protection layer disposed between the interdigital transducer and the temperature compensation layer and configured to protect the interdigital transducer from being oxidized.

14 Claims, 27 Drawing Sheets

(56) References Cited

U.S. PATENT DOCUMENTS

| | | | |
|---|---|---|---|
| 10,840,878 B2* | 11/2020 | Daimon | H03H 9/25 |
| 10,951,192 B2* | 3/2021 | Saji | H03H 9/02015 |
| 11,177,791 B2* | 11/2021 | Solal | H03H 9/1457 |
| 11,368,137 B2* | 6/2022 | Goto | H03H 9/1457 |
| 11,652,466 B2* | 5/2023 | Fujiwara | H03H 9/25 |
| | | | 333/193 |
| 2018/0054179 A1 | 2/2018 | Gamble et al. | |
| 2023/0344408 A1* | 10/2023 | Torazawa | H03H 9/02992 |

FOREIGN PATENT DOCUMENTS

| | | |
|---|---|---|
| CN | 113489471 A | 10/2021 |
| CN | 215452905 U | 1/2022 |
| CN | 115296642 A | 11/2022 |

* cited by examiner

SURFACE ACOUSTIC WAVE RESONATOR STRUCTURE AND METHOD OF FORMING THE SAME, AND FILTER

CROSS-REFERENCE TO RELATED APPLICATION

The application claims priority to the Chinese patent application No. 202211219108.0, filed Oct. 8, 2022, the entire disclosure of which is incorporated herein by reference as part of the present application.

TECHNICAL FIELD

The embodiments of the present disclosure relate to a surface acoustic wave resonator structure and a method of forming the same and a filter, and in particular to a temperature compensated surface acoustic wave resonator and method of forming the same.

BACKGROUND

With the rapid development of mobile communication technology, filters based on resonators are becoming more and more widely used in communication devices such as smartphones. Surface acoustic wave (SAW) filters, as a type of acoustic wave filter, have the advantages of small size and light weight, and are widely used in current communication devices. Among the surface acoustic wave filters, the temperature compensated surface acoustic wave filters have high quality factor, low loss, and low temperature drift, and thus have superior performance. However, the process of forming a temperature compensation layer of the traditional temperature compensation SAW resonator/filter is easy to cause adverse effects on other metal structures; on the other hand, clutter in spurious mode is existed in the traditional SAW resonator/filter, which affects the performance of the resonator/filter.

SUMMARY

At least one embodiment of the disclosure provides a surface acoustic wave resonator structure, comprising: a piezoelectric substrate; an interdigital transducer, comprising a first interdigital electrode structure and a second interdigital electrode structure, disposed side by side on the piezoelectric substrate, wherein the first interdigital electrode structure comprises first interdigital electrodes and a first interdigital electrode lead-out part connected to each other, the second interdigital electrode structure comprises second interdigital electrodes and a second interdigital electrode lead-out part connected to each other, the first interdigital electrodes and the second interdigital electrodes extend along a first direction and are alternately arranged in a second direction, the first direction and the second direction intersect with each other; a temperature compensation layer, disposed on a side of the interdigital transducer away from the piezoelectric substrate; and a first protection layer, disposed between the interdigital transducer and the temperature compensation layer, wherein the first protection layer is configured to protect the interdigital transducer from being oxidized.

The surface acoustic wave resonator structure according to at least one embodiment of the disclosure further comprises: a clutter suppression structure, comprising a first clutter suppression layer and a second clutter suppression layer, each of which extends across the first interdigital electrodes and the second interdigital electrodes along the second direction, wherein the first clutter suppression layer and the second clutter suppression layer are arranged side by side in the first direction, and each of the first clutter suppression layer and the second clutter suppression layer is overlapped with the first interdigital electrodes and the second interdigital electrodes in a third direction perpendicular a main surface of the piezoelectric substrate.

In the surface acoustic wave resonator structure according to at least one embodiment of the disclosure, the first clutter suppression layer has an edge aligned with an edge of the second interdigital electrodes away from the second interdigital electrode lead-out part in the third direction, the second clutter suppression layer has an edge aligned with an edge of the first interdigital electrodes away from the first interdigital electrode lead-out part in the third direction.

In the surface acoustic wave resonator structure according to at least one embodiment of the disclosure, the clutter suppression structure comprises a metal structure, and the metal structure is disposed on a side of the first interdigital electrodes and the second interdigital electrodes away from the piezoelectric substrate, and the metal structure comprises a first metal strip serving as the first clutter suppression layer and a second metal strip serving as the second clutter suppression layer.

In the surface acoustic wave resonator structure according to at least one embodiment of the disclosure, the metal structure is embedded in the temperature compensation layer, and the temperature compensation layer comprises: a first temperature compensation sublayer, disposed on a side of the first protection layer away from the first interdigital electrode structure and the second interdigital electrode structure, wherein the metal structure is disposed on a side of the first compensation sublayer away from the first protection layer; and a second temperature compensation sublayer, disposed on a side of the first temperature compensation sublayer and the metal structure away from the first protection layer.

In the surface acoustic wave resonator structure according to at least one embodiment of the disclosure, the clutter suppression structure further comprises: a second protection layer, disposed at least between the metal structure and the second temperature compensation sublayer to cover sidewalls of the metal structure and a surface of the metal structure at a side close to the second temperature compensation sublayer, and the second protection layer is configured to protect the metal structure from being oxidized.

In the surface acoustic wave resonator structure according to at least one embodiment of the disclosure, the second protection layer is further disposed between the first temperature compensation sublayer and the second temperature compensation sublayer, and a sidewall of the second protection layer is aligned with sidewalls of the first temperature compensation sublayer and the second temperature compensation sublayer in a direction perpendicular to the main surface of the piezoelectric substrate.

In the surface acoustic wave resonator structure according to at least one embodiment of the disclosure, the clutter suppression structure comprises a doped structure disposed in the piezoelectric substrate, and the doped structure comprises a first doped region serving as the first clutter suppression layer and a second doped region serving as the second clutter suppression layer.

In the surface acoustic wave resonator structure according to at least one embodiment of the disclosure, the doped structure comprises hydrogen ions or helium ions.

In the surface acoustic wave resonator structure according to at least one embodiment of the disclosure, the doped structure is in contact with portions of surfaces of the first interdigital electrodes and the second interdigital electrodes at a side close to the piezoelectric substrate.

In the surface acoustic wave resonator structure according to at least one embodiment of the disclosure, portions of the first protection layer are sandwiched between the temperature compensation layer and the doped structure.

In the surface acoustic wave resonator structure according to at least one embodiment of the disclosure, a material of the temperature compensation layer is different from a material of the first protection layer.

In the surface acoustic wave resonator structure according to at least one embodiment of the disclosure, the temperature compensation layer comprises silicon oxide, and the first protection layer is configured to prevent the first interdigital electrode structures and the second interdigital electrode structures from being oxidized during a process of forming the temperature compensation layer.

In the surface acoustic wave resonator structure according to at least one embodiment of the disclosure, the first protection layer comprises silicon nitride or aluminum nitride.

In the surface acoustic wave resonator structure according to at least one embodiment of the disclosure, a sidewall of the temperature compensation layer and a sidewall of the first protection layer are aligned with each other in a direction perpendicular to the piezoelectric substrate.

The surface acoustic wave resonator structure according at least one embodiment of the disclosure further comprises: a first conductive connector, disposed on a side of the first interdigital electrode lead-out part away from the piezoelectric substrate, and electrically connected to the first interdigital electrodes through the first interdigital electrode lead-out part; and a second conductive connector, disposed on a side of the second interdigital electrode lead-out part away from the piezoelectric substrate, and electrically connected to the second interdigital electrodes through the second interdigital electrode lead-out part.

The surface acoustic wave resonator structure according at least one embodiment of the disclosure further comprises: a passivation layer, disposed on the piezoelectric substrate, and covering portions of surfaces of the first conductive connector and the second conductive connector, sidewalls of the first protection layer and the temperature compensation layer, and a surface of the temperature compensation layer away from the piezoelectric substrate.

At least one embodiment of the disclosure provides a filter, comprising the surface acoustic wave resonator structure according to any embodiments as mentioned above.

At least one embodiment of the disclosure provides a method of forming a surface acoustic wave resonator structure, comprising: providing a piezoelectric substrate; forming an interdigital transducer on the piezoelectric substrate, wherein the interdigital transducer comprises a first interdigital electrode structure and a second interdigital electrode structure disposed side by side on the piezoelectric substrate; the first interdigital electrode structure comprises first interdigital electrodes and a first interdigital electrode lead-out part connected to each other, and the second interdigital electrode structure comprises second interdigital electrodes and a second interdigital electrode lead-out part connected to each other, the first interdigital electrodes and the second interdigital electrodes extend along a first direction and are alternately arranged in a second direction, the first direction and the second direction intersect with each other; forming a first protection layer on the interdigital transducer to cover sidewalls of the interdigital transducer and a surface of the interdigital transducer away from the piezoelectric substrate; and forming a temperature compensation layer on the first protection layer, wherein the first protection layer is located between the interdigital transducer and the temperature compensation layer, and configured to protect the interdigital transducer from being oxidized.

In the method of forming the surface acoustic wave resonator structure according to at least one embodiment of the disclosure, the first protection layer is configured to protect the interdigital transducer from being oxidized during a forming process of the temperature compensation layer.

In the method of forming the surface acoustic wave resonator structure according to at least one embodiment of the disclosure, a forming process of the temperature compensation layer comprises: forming a silicon oxide layer by a physical vapor deposition process, during which a silicon target is used, and oxygen is introduced into a deposition chamber, wherein the silicon oxide layer serves as the temperature compensation layer; and during the forming process of the temperature compensation layer, the first protection layer isolates the interdigital transducer from oxygen in the deposition chamber, so as to prevent the interdigital transducer from being oxidized.

The method of forming the surface acoustic wave resonator structure according to at least one embodiment of the disclosure further comprises: forming a clutter suppression structure, comprising a first clutter suppression layer and a second clutter suppression layer, wherein each of the first clutter suppression layer and the second clutter suppression layer extends across the first interdigital electrodes and the second interdigital electrodes along the second direction, and the first clutter suppression layer and the second clutter suppression layer are arranged side by side in the first direction, and each of the first clutter suppression layer and the second clutter suppression layer is overlapped with the first interdigital electrodes and the second interdigital electrodes in a direction perpendicular to a main surface of the piezoelectric substrate.

In the method of forming the surface acoustic wave resonator structure according to at least one embodiment of the disclosure, forming the clutter suppression structure comprises: forming a metal structure embedded in the temperature compensation layer, the metal structure is disposed on a side of the interdigital transducer away from the piezoelectric substrate, and comprises a first metal strip serving as the first clutter suppression layer and a second metal strip serving as the second clutter suppression layer.

In the method of forming the surface acoustic wave resonator structure according to at least one embodiment of the disclosure, the temperature compensation layer comprises a first temperature compensation sublayer and a second temperature compensation sublayer, and forming the temperature compensation layer and the clutter suppression structure comprises: forming a first temperature compensation sublayer on a side of the first protection layer away from the piezoelectric substrate and the interdigital transducer; forming the metal structure on a side of the first temperature compensation sublayer away from the first protection layer; and forming the second temperature compensation sublayer on a side of the first temperature compensation sublayer and the metal structure away from the first protection layer.

The method of forming the surface acoustic wave resonator structure according to at least one embodiment of the disclosure further comprises: before forming the second temperature compensation sublayer, forming a second protection layer on a side of the first temperature compensation sublayer and the metal structure away from the first protection layer, wherein during a process of forming the second temperature compensation sublayer, the second protection layer isolates the metal structure from oxygen in a deposition chamber, so as to prevent the metal structure from being oxidized.

In the method of forming the surface acoustic wave resonator structure according to at least one embodiment of the disclosure, the first temperature compensation sublayer and the second temperature compensation sublayer are separated apart from each other by the second protection layer.

The method of forming the surface acoustic wave resonator structure according to at least one embodiment of the disclosure further comprises: performing a patterning process on the second protection layer to remove a portion of the second protection layer covering the first temperature compensation sublayer, and remain a portion of the second protection layer covering the metal structure, wherein after forming the second temperature compensation sublayer, a portion of the second temperature compensation sublayer is in contact with the first temperature compensation sublayer.

In the method of forming the surface acoustic wave resonator structure according to at least one embodiment of the disclosure, forming the clutter suppression structure comprises: before forming the interdigital transducer, performing an ion implantation process on the piezoelectric substrate to form a doped structure in the piezoelectric substrate, and the doped structure comprises a first doped region serving as the first clutter suppression layer and a second doped region serving as the second clutter suppression layer.

In the method of forming the surface acoustic wave resonator structure according to at least one embodiment of the disclosure, performing the ion implantation process comprises implanting hydrogen ions or helium ions into the piezoelectric substrate.

The method of forming the surface acoustic wave resonator structure according to at least one embodiment of the disclosure further comprises: removing portions of the first protection layer and the temperature compensation layer to expose a portion of the first interdigital electrode lead-out part and a portion of the second interdigital electrode lead-out part; forming a first conductive connector and a second conductive connector on the portion of the first interdigital electrode lead-out part and the portion of the second interdigital electrode lead-out part, respectively; and forming a passivation layer on the piezoelectric substrate to cover portions of surfaces of the first conductive connector and the second conductive connector, sidewalls of the first protection layer and the temperature compensation layer, and a surface of the temperature compensation layer away from the piezoelectric substrate.

BRIEF DESCRIPTION OF DRAWINGS

In order to more clearly illustrate the technical solutions of embodiments of the present disclosure, the accompanying drawings of the embodiments will be briefly described below, and it will be apparent that the accompanying drawings in the following description relate only to some embodiments of the present disclosure and are not a limitation of the present disclosure. It should be noted that, in accordance with standard practice in the field, the various features are not drawn to scale. Indeed, the size of the various features may be arbitrarily increased or decreased for the sake of clarity.

FIG. 1B and FIG. 1C are cross-sectional views respectively taken along a line B-B' and a line C-C' of FIG. 1A.

FIG. 2B and FIG. 2C are cross-sectional views respectively taken along a line B-B' and a line C-C' of FIG. 2A.

FIG. 4B and FIG. 4C are cross-sectional views respectively taken along a line B-B' and a line C-C' of FIG. 4A.

DETAILED DESCRIPTION

Figure 1A:
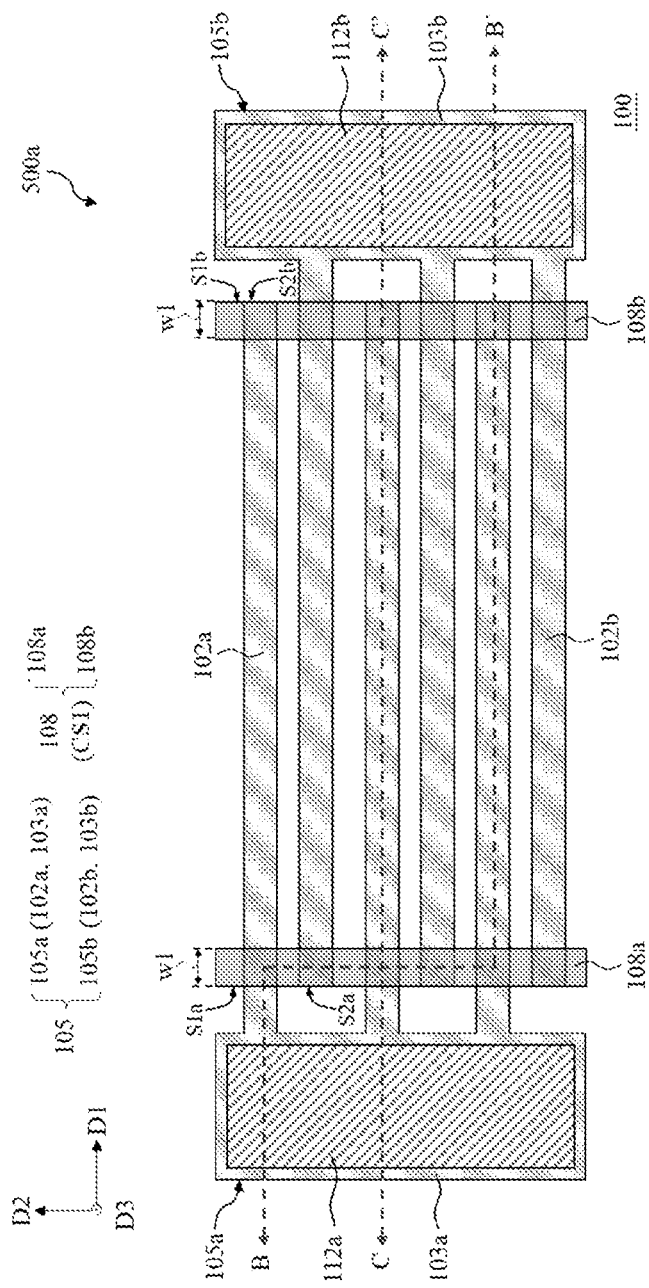
FIG. 1A illustrates a schematic top view of a surface acoustic wave resonator structure according to some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

In the embodiment of the present disclosure, the orientation or position relationship indicated by the terms "on", "under", "inside", "middle", "outside", "front", "back", etc. is based on the orientation or position relationship shown in the drawings. These terms are mainly used to better describe the embodiments of the present disclosure, and are not used to define that the indicated device, element or component must have a specific orientation, or be constructed and operated in a specific orientation. In addition to the orientations illustrated in the drawings, the spatial relativity term is intended to cover different orientations of devices in use or operation. The equipment can be oriented in other ways (rotated by 90 degrees or in other orientations), and the terms of spatial relativity used herein can also be interpreted accordingly. In addition, some of the above terms may be used to express other meanings besides orientation or position relationship, for example, the term "on" may also be used to express some dependency or connection relationship in some cases. For those skilled in the art, the specific meanings of these terms in the embodiments of the present disclosure can be understood according to specific situations.

The embodiments of the present disclosure provide a surface acoustic wave resonator structure, which is a temperature compensated surface acoustic wave resonator, and includes a temperature compensation layer disposed on a side of an interdigital transducer away from a piezoelectric substrate. In various embodiments of the present disclosure, a protection layer is disposed between the interdigital transducer and the temperature compensation layer, the protection layer is configured to protect the interdigital transducer from being oxidized. For example, the temperature compensation layer usually includes silicon oxide, and oxygen is introduced into a deposition chamber during the process of depositing the temperature compensation layer. The interdigital transducer may be oxidized upon being exposed to oxygen, thereby reducing the device performance of the resonator. In the embodiments of the present disclosure, since the protection layer is disposed on the interdigital transducer, the protection layer can separate the interdigital transducer apart from oxygen in the environment (e.g., in the deposition chamber) during the subsequent process of forming the temperature compensation layer, thereby presenting the interdigital transducer from being oxidized, and further improving the device performance of the resonator.

On the other hand, in the embodiments of the present disclosure, the surface acoustic wave resonator structure is provided with a clutter suppression structure, so as to suppress the formation and propagation of clutter wave in the resonator. The clutter suppression structure includes a first clutter suppression layer and a second clutter suppression layer, the first clutter suppression layer and the second clutter suppression layer are arranged side by side and respectively extend across a plurality of interdigital electrodes of the interdigital transducer, and are each overlapped with a plurality of interdigital electrodes in a direction perpendicular to the main surface of the piezoelectric substrate. Through disposing the clutter suppression structure to suppress the formation and propagation of clutter wave, energy loss can be reduced or avoided, thereby improving the device performance of the resonator. The clutter suppression structure may include a metal structure disposed on a side of the interdigital electrodes away from the piezoelectric substrate, and/or include a doped structure disposed in the piezoelectric substrate. In some embodiments in which the clutter suppression structure includes the metal structure, the metal structure is embedded in the temperature compensation layer; for example, the metal structure is disposed between two temperature compensation sublayers of the temperature compensation layer, and a protection layer is also disposed between the metal structure and the temperature compensation layer, so as to protect the metal structure from being oxidized, for example, during the process of forming the temperature compensation sublayer, thereby avoiding issues such as degradation of clutter suppression performance caused by oxidation of the metal structure, such that the clutter suppression structure including the metal structure can effectively suppress the formation and/or propagation of clutter wave, thereby improving the clutter suppression performance of the resonator.

Figure 1B:
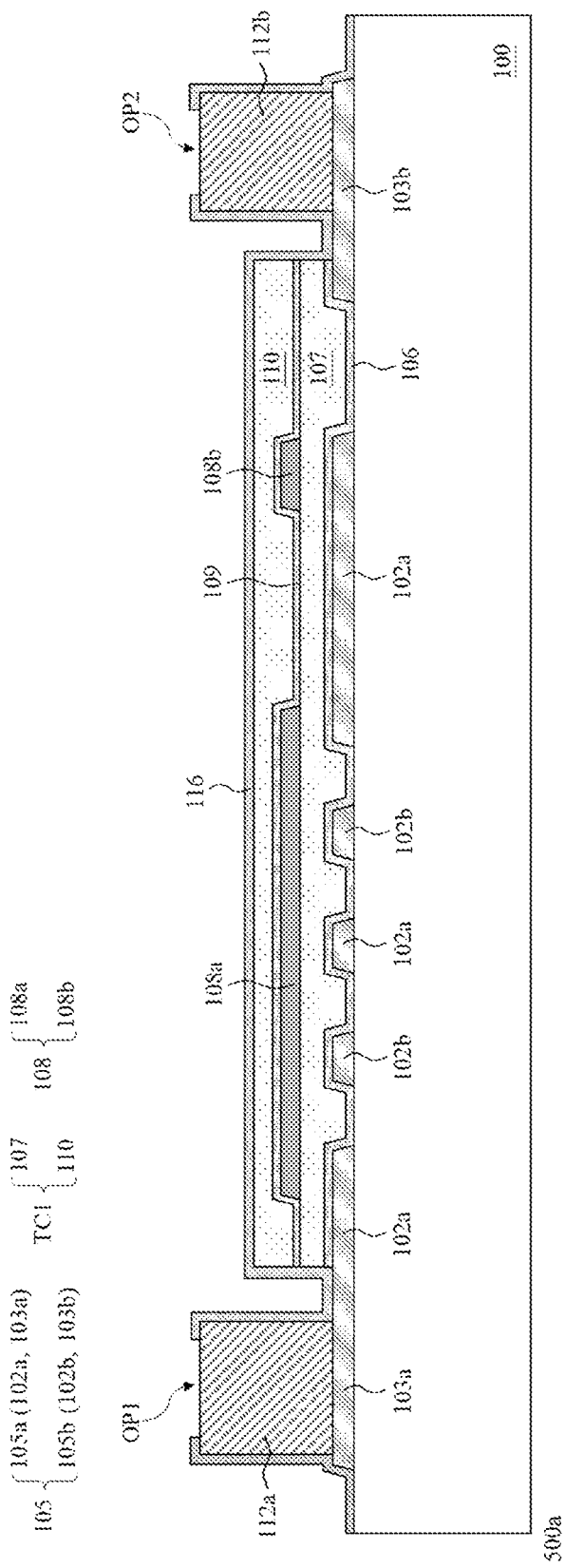
FIG. 1B and FIG. 1C illustrate schematic cross-sectional views of the surface acoustic wave resonator structure according to some embodiments of the present disclosure.
Figure 1C:
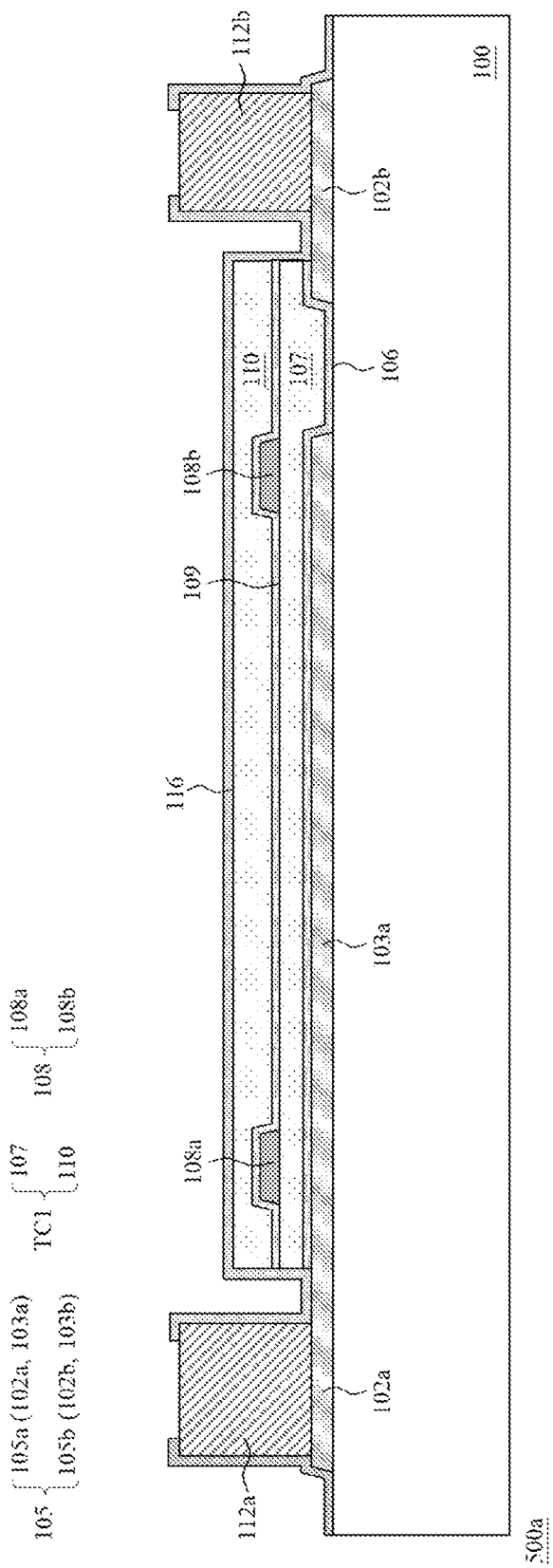

FIG. 1A is a schematic top view of a surface acoustic wave resonator structure according to some embodiments of the present disclosure; FIG. 1B and FIG. 1C are schematic cross-sectional views of the surface acoustic wave resonator structure according to some embodiments of the present disclosure, and FIG. 1B and FIG. 1C are cross-sectional views respectively taken along the line B-B' and the line C-C' in FIG. 1A.

Referring to FIG. 1A to FIG. 1C, in some embodiments, the surface acoustic wave resonator structure 500a may be or include a temperature compensated surface acoustic wave (TC-SAW) resonator. For example, the surface acoustic wave resonator structure 500a includes a piezoelectric substrate 100, an interdigital transducer (IDT) 105, a protection layer 106, a temperature compensation layer TC1, a clutter suppression structure CS1, conductive connectors 112a and 112b and a passivation layer 116. The temperature compensation layer TC1 may be a single-layer structure or a multi-layer structure. In some embodiments, the temperature compensation layer TC1 is a multilayer structure including a plurality of temperature compensation sublayers. For example, the temperature compensation layer TC1 includes a temperature compensation sublayer 107 and a temperature compensation sublayer 110. The protection layer 106 is disposed between the interdigital transducer 105 and the temperature compensation layer TC1 to protect the interdigital transducer 105 from being oxidized. The clutter suppression structure CS1 may be embedded in the temperature compensation layer TC1, for example, between the temperature compensation sublayer 107 and the temperature compensation sublayer 110. In some embodiments, the clutter suppression structure CS1 includes a metal structure 108 to suppress the formation and/or propagation of transverse waves in spurious modes (i.e., clutter wave). In some embodiments, the clutter suppression structure CS1 further includes a protection layer 109 disposed on the metal structure 108 to protect the metal structure 108 from being oxidized, thereby avoiding issues such as degradation of clutter suppression performance caused by oxidation of the metal structure. For example, the protection layer 109 is disposed at least between the metal structure 108 and a portion of the temperature compensation layer TC1 (e.g., the temperature compensation sublayer 110), so as to protect the metal structure 108 from being oxidized.

The piezoelectric substrate 100 may include a suitable piezoelectric material, such as piezoelectric crystal, piezoelectric ceramic, or the like. For example, the material of the piezoelectric substrate 100 may be or include aluminum nitride (AlN), doped aluminum nitride, zinc oxide (ZnO), lead zirconate titanate (PZT), lithium niobate (LiNbO3), Quartz, potassium niobate (KNbO3), lithium tantalate (LiTaO3), the like, or combinations thereof. In some embodiments, the piezoelectric substrate 100 may be a single-layer structure or a multi-layer structure, such as a piezoelectric film composite structure, such as a composite structure of lithium tantalate piezoelectric film/silicon dioxide/silicon substrate. However, the present disclosure is not limited thereto.

In some embodiments, the interdigital transducer 105 is disposed on the piezoelectric substrate 100, and includes an interdigital electrode structure 105a and an interdigital electrode structure 105b. The interdigital electrode structure 105a includes a plurality of interdigital electrodes 102a and an interdigital electrode lead-out part 103a connected to each other; the plurality of interdigital electrodes 102a extend substantially parallel to each other along the direction D1, and are arranged along the direction D2, the direction D1 and the direction D2 are parallel to the main surface (e.g., the top surface shown in the drawing) of the piezoelectric substrate 100, and intersect with each other, for example, the direction D1 and the direction D2 are approximately perpendicular to each other. In some embodiments, the interdigital electrode lead-out part 103a is located at the ends of the plurality of interdigital electrodes 102a in the direction D1, and is connected to the plurality of interdigital electrodes 102a, such that the plurality of interdigital electrodes 102a are electrically connected to each other through the interdigital electrode lead-out part 103a. In some embodiments, the interdigital electrode lead-out part may also be referred to as a busbar. The direction D1 and the direction D2 may be respectively referred to as a first direction and a second direction, or vice versa. Similar to the interdigital electrode structure 105a, the interdigital electrode structure 105b includes a plurality of interdigital electrodes 102b and an interdigital electrode lead-out part 103b that are connected to each other. The plurality of interdigital electrodes 102b extend along the direction D1 and are arranged along the direction D2; the interdigital electrode lead-out part 103 is located at ends of the plurality of interdigital electrodes 102b in the direction D1 and is connected to the plurality of interdigital electrodes 102b.

In some embodiments, the plurality of interdigital electrodes 102a and the plurality of interdigital electrodes 102b are alternately arranged along the direction D2 and spaced apart from each other. In other words, the interdigital electrode lead-out part 103a and the interdigital electrode lead-out part 103b are located on opposite sides of the plurality of interdigital electrodes 102a and 102b in the direction D1, and are respectively connected to the corresponding ends (e.g., first ends) of the plurality of interdigital electrodes 102a and the ends (e.g., first ends) of the plurality of interdigital electrodes 102b; while the other ends of the plurality of interdigital electrodes 102a (e.g., second ends opposite to their first ends in the direction D1) and the other ends of the plurality of interdigital electrodes 102b (e.g., second ends opposite to their first ends in the direction D1) are facing or close to and spaced apart from the interdigital electrode lead-out part 103b and the interdigital electrode lead-out part 103a, respectively. In some embodiments, the interdigital electrode structure 105a and the interdigital electrode structure 105b may be respectively referred to as a first interdigital electrode structure and a second interdigital electrode structure, the interdigital electrode 102a and the interdigital electrode 102b may be respectively referred to as a first interdigital electrode and a second interdigital electrode, the interdigital electrode lead-out part 103a and the interdigital electrode lead-out part 103b may be respectively referred to as a first interdigital electrode lead-out part and a second interdigital electrode lead-out part, or vice versa.

In some embodiments, the protection layer 106 is disposed on a side of the interdigital transducer 105 away from the piezoelectric substrate 100 to cover at least a portion of the surface of the interdigital transducer 105. In some embodiments, the protection layer 106 at least covers the sidewalls of the plurality of interdigital electrodes 102a and 102b and the surfaces thereof at the side away from the piezoelectric substrate 100, and may further cover portions of the surfaces of the interdigital electrode lead-out parts 103a and 103b, such as the respective sidewalls of the interdigital electrode lead-out parts 103a and 103b that are close to the interdigital electrodes 102b and 102a and portions of the surfaces of the interdigital electrode lead-out parts 103a and 103b at the side away from the piezoelectric substrate 100. In some embodiments, the protection layer 106 may also be referred to as a first protection layer.

In some embodiments, the temperature compensation sublayer 107 is disposed on a side of the protection layer 106 away from the interdigital transducer 105, that is to say, the protection layer 106 is located between the temperature compensation sublayer 107 and the respective interdigital electrodes and/or interdigital electrode lead-out parts of the interdigital transducer 105, such that the temperature compensation sublayer 107 is spaced apart from the respective interdigital electrodes and/or interdigital electrode lead-out parts of the interdigital transducer 105. The protection layer 106 and the temperature compensation sublayer 107 may be or include different materials. In some embodiments, the protection layer 106 is configured to prevent the interdigital transducer 105 from being oxidized, for example, during the process of forming the temperature compensation sublayer 107.

In some embodiments, the metal structure 108 is disposed on a side of the temperature compensation sublayer 107 away from the protection layer 106 and the interdigital transducer 105. In some embodiments, the metal structure 108 includes a plurality of metal strips 108a and 108b. The metal strips 108a and 108b may respectively be referred to as a first metal strip and a second metal strip. The metal strips 108a and 108b substantially extend parallel to each other along the direction D2, and each extend across the plurality of interdigital electrodes 102a and 102b, for example. In other words, each of the metal strips 108a and 108b is overlapped with the plurality of interdigital electrodes 102a and 102b in a direction (e.g., the direction D3) perpendicular to the main surface of the piezoelectric substrate 100; that is, in the direction perpendicular to the main surface of the piezoelectric substrate 100, the orthographic projections of the metal strips 108a and 108b on the main surface of the piezoelectric substrate 100 are each overlapped (partially overlapped) with the orthographic projections of the plurality of interdigital electrodes 102a and of 102b on the main surface of the piezoelectric substrate 100. In some embodiments, the metal strip 108a extends across the plurality of interdigital electrodes 102a and 102b, and is located over the ends (or edges) of the interdigital electrodes 102b away from the interdigital electrode lead-out part 103b and close to the interdigital electrode lead-out part 103a; for example, the metal strip 108a has sidewalls (or edges) opposite to each other in the direction D1, and the sidewall (or edge) S1a of the metal strip 108a away from the interdigital electrode lead-out part 103b and facing or close to the conductive connector 112a and the interdigital electrode lead-out part 103a is substantially aligned with the sidewalls (or edges) S2a of one or more interdigital electrodes 102b away from the interdigital electrode 103b and facing or close to the interdigital electrode 103a in the direction (e.g., the direction D3) perpendicular to the main surface of the piezoelectric substrate 100. The metal strip 108b extends across a plurality of interdigital electrodes 102a and 102b, and is located over the ends (or edges) of one or more interdigital electrodes 102a away from the interdigital electrode lead-out part 103a and close to the interdigital electrode lead-out part 103b; for example, the metal strip 108b has sidewalls (or edges) opposite to each other in the direction D1, and the sidewall (or edge) S1b of the metal strip 108b facing or close to the conductive connector 112b and the interdigital electrode lead-out part 103b is substantially aligned with the sidewalls (or edges) S2b of one or more interdigital electrodes 102a facing or close to the interdigital electrode 103b in the direction (e.g., the direction D3) perpendicular to the main surface of the piezoelectric substrate 100.

In some embodiments, the widths w1 in the direction D1 of the metal strips 108a and 108b of the metal structure 108 may be substantially the same as each other, for example, the width w1 may range from 0.5 μm to 10 μm; the width of the metal strip is disposed to be not less than 0.5 μm, which can effectively suppress the formation and propagation of clutter wave; and the width of the metal strip may be disposed to be within 10 μm, thereby avoiding obvious reduction of effective area of the resonator due to the area occupied by the clutter suppression structure being too large, and further balancing the impact on the performance of the resonator device. However, the embodiments of the present disclosure are not limited to the above-mentioned width range, and the width of the metal strip can be adjusted appropriately based on product requirement (e.g., the frequency of the resonator, etc.).

Still referring to FIG. 1A to FIG. 1C, in some embodiments, a protection layer 109 is disposed on a side of the metal structure 108 away from the interdigital electrodes and the temperature compensation sublayer 107, and the protection layer 109 at least covers the sidewalls of the metal structure 108 and the surface of the metal structure 108 at the side away from the temperature compensation sublayer 107; in some embodiments, the protection layer 109 continuously extends on the temperature compensation sublayer 107, and further covers the surface of the temperature compensation sublayer 107 at the side away from the interdigital electrodes and the protection layer 106. In this embodiment, the metal structure 108 and the protection layer 109 covering thereon together constitute the clutter suppression structure CS1, the metal strip 108a and the protection layer 109 covering thereon, and the metal strip 108b and the protection layer 109 covering thereon respectively serve as a first clutter suppression layer and a second clutter suppression layer (or vice versa) of the clutter suppression structure CS1, so as to suppress the formation and/or propagation of clutter wave in the region between the first clutter suppression layer the second clutter suppression layer in the direction D1.

In some embodiments, a temperature compensation sublayer 110 is disposed on a side of the protection layer 109 away from the metal structure 108 and the temperature compensation sublayer 107; the protection layer 109 is located at least between the metal structure 108 and the temperature compensation sublayer 110 to cover the sidewalls of the metal structure 108 and the surface of the metal structure 108 at the side close to the temperature compensation sublayer 110, so as to separate the temperature compensation sublayer 110 apart from the metal structure 108; in some embodiments, the protection layer 109 is further disposed between the temperature compensation sublayer 110 and the temperature compensation sublayer 107, and separates the temperature compensation sublayer 110 and the temperature compensation sublayer 107 apart from each other, but the disclosure is not limited thereto.

In some embodiments, the sidewalls of the protection layer 106, the temperature compensation sublayer 107, the protection layer 109, and the temperature compensation sublayer 110 are substantially aligned with each other in a direction (e.g., the direction D3) perpendicular to the main surface of the piezoelectric substrate 100.

In this embodiment, the temperature compensation sublayer 107 and the temperature compensation sublayer 110 together constitute the temperature compensation layer TC1 of the surface acoustic wave resonator structure 500a. The metal structure 108 and the protection layer 109 covering thereon together serve as the clutter suppression structure to suppress clutter wave (or referred to as clutter transverse wave), for example, propagating in a direction parallel to the extending direction (e.g., direction D1) of the interdigital electrodes. For example, during the operation of the surface acoustic wave resonator structure 500a, the surface acoustic wave propagates along the arrangement direction (e.g., the direction D2) of the plurality of interdigital electrodes 102a and 102b of the interdigital transducer 105, however, there may further exist some clutter wave propagating along the extending direction (e.g., the direction D1) of the interdigital electrodes, and such clutter wave may cause energy loss and further result in degradation of performance of the resonator/filter. In the embodiments of the disclosure, the clutter suppression structure including metal strips 108a and 108b (i.e., first and second clutter suppression layers) respectively disposed on the edges of the two sets of interdigital electrodes can generate a region or interface where the impedance changes, thereby suppressing the clutter wave propagating in the direction D1, and the clutter wave propagating in the direction D1 can be reflected back into the resonator, thereby reducing energy loss.

The protection layer 106 and the protection layer 109 are respectively disposed on the interdigital transducer 105 and the metal structure 108, and separate the interdigital transducer 105 and the metal structure 108 apart from the temperature compensation layer TC1, so as to protect the interdigital transducer 105 and the metal structure 108, for example, the protection layers 106 and 109 can prevent the interdigital transducer 105 and the metal structure 108 from being oxidized during the process of forming the temperature compensation layer, thereby avoiding degradation of the performance of the resonator caused by the oxidation of the interdigital transducer 105 and/or degradation of clutter suppression performance due to oxidation of the metal structure 108, thereby improving the device performance of the resonator.

Still referring to FIG. 1A to FIG. 1C, in some embodiments, the conductive connectors 112a and 112b are respectively disposed on the interdigital electrode lead-out parts 103a and 103b, such as disposed on the sides of the interdigital electrode lead-out parts 103a and 103b away from the piezoelectric substrate 100. The conductive connectors 112a and 112b are electrically connected to the interdigital electrode lead-out parts 103a and 103b, and are at least partially overlapped (and may be completely overlapped) with the interdigital electrode lead-out parts 103a and 103b in a direction (e.g., the direction D3) perpendicular to the main surface of the piezoelectric substrate 100, respectively.

In some embodiments, a passivation layer 116 is disposed above the piezoelectric substrate 100, and the passivation layer 116 covers a portion of the main surface of the piezoelectric substrate 100, the sidewalls of the interdigital transducer 105 (e.g., the interdigital electrode lead-out parts 103*a* and 103*b*) and a portion of the surface thereof at the side away from the piezoelectric substrate 100, the sidewalls of the conductive connectors 112*a* and 112*b* and portions of the surfaces of the conductive connectors 112*a* and 112*b* at the side away from the piezoelectric substrate 100, sidewalls of the protection layers 106 and 109 and the temperature compensation sublayers 107 and 110, and the surface of the temperature compensation sublayer 110 at the side away from the piezoelectric substrate 100.

In some embodiments, the passivation layer 116 has an opening OP1 and an opening OP2, and the openings OP1 and OP2 respectively expose portions of the surfaces of the conductive connectors 112*a* and 112*b* at the side away from the piezoelectric substrate 100, so as to provide external connection windows.

Figure 2A:
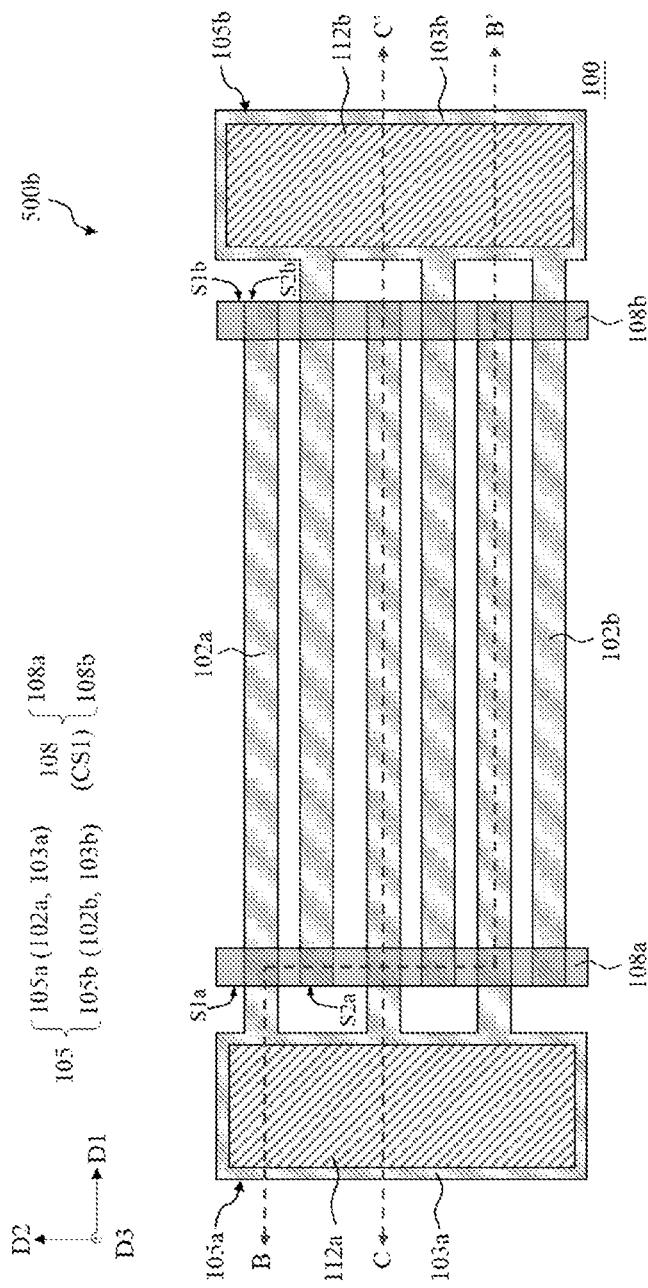
FIG. 2A illustrates a schematic top view of a surface acoustic wave resonator structure according to some other embodiments of the present disclosure.
Figure 2B:
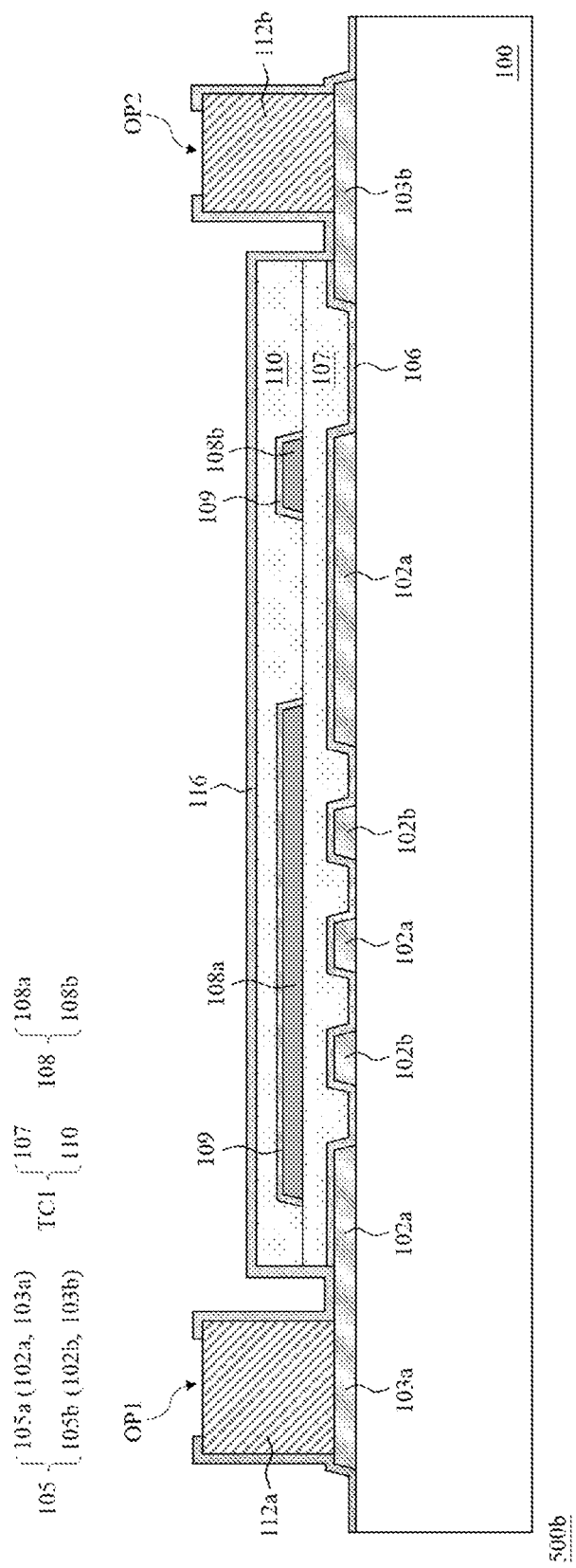
FIG. 2B and FIG. 2C illustrate schematic cross-sectional views of the surface acoustic wave resonator structure according to some other embodiments of the present disclosure.
Figure 2C:
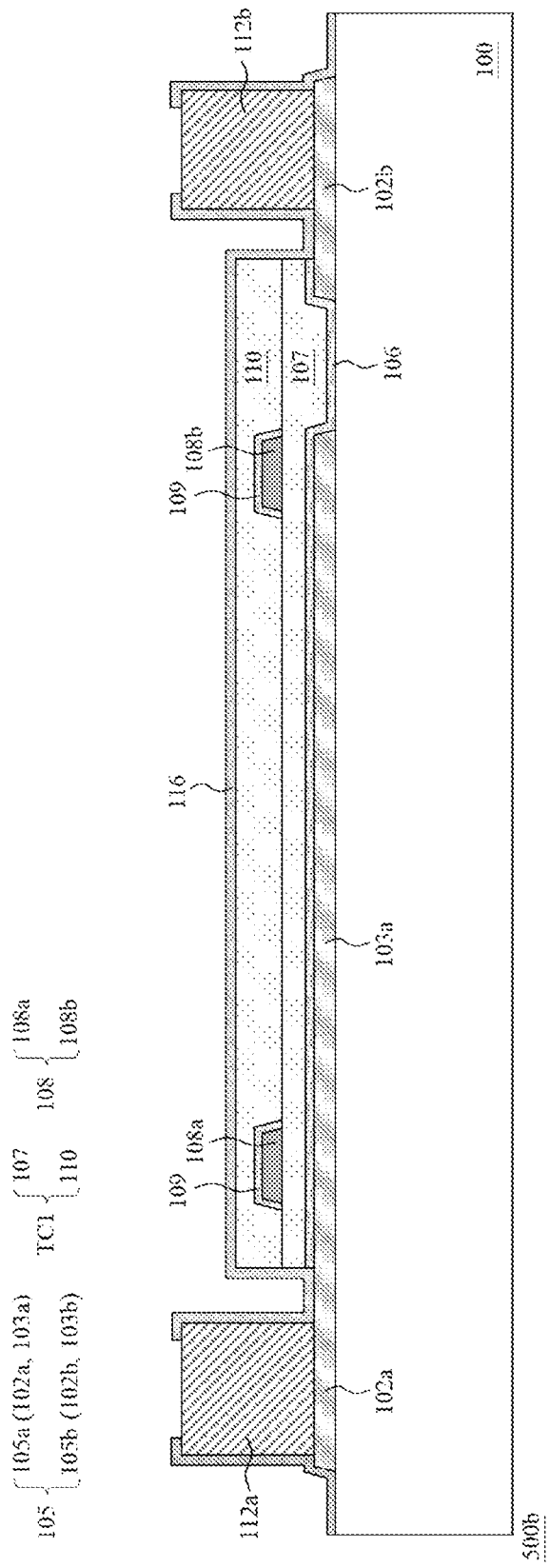

FIG. 2A is a schematic top view of a surface acoustic wave resonator structure according to some other embodiments of the present disclosure; FIG. 2B and FIG. 2C are schematic cross-sectional views of a surface acoustic wave resonator structure according to some other embodiments of the present disclosure, and FIG. 2B and FIG. 2C are cross-sectional views respectively taken along the line B-B' and the line C-C' in FIG. 2A. The surface acoustic wave resonator structure 500*b* illustrated in FIG. 2A to FIG. 2C is similar to the surface acoustic wave resonator structure 500*a* illustrated in FIG. 1A to FIG. 1C, the difference lies in that: in the surface acoustic resonator structure 500*b*, the protection layer 109 covers the surface of the metal structure 108, but does not completely cover the surface of the temperature compensation sublayer 107 at the side away from the protection layer 106.

Referring to FIG. 2A to FIG. 2C, in some embodiments, the protection layer 109 is disposed on the side of the temperature compensation sublayer 107 away from the protection layer 106 and the interdigital transducer 105, and is disposed between the metal structure 108 and the temperature compensation sublayer 110, and the protection layer 109 covers (e.g., completely covers) the sidewalls of the metal structure 108 and the surface of the metal structure 108 at the side away from the temperature compensation sublayer 107; a portion of the protection layer 109 covering the sidewalls of the metal structure 108 also covers a portion of the surface of the temperature compensation sublayer 107 at the side away from the protection layer 106; the protection layer 109 has a plurality of portions (e.g., a first portion and a second portion) respectively covering the metal strips 108*a* and 108*b*. In this embodiment, the protection layer 109 is a discontinuous layer, and the portion thereof covering the metal strip 108*a* and the portion thereof covering the metal strip 108*b* are spaced apart from each other; there has no protection layer disposed between portions of the temperature compensation sublayer 110 and the temperature compensation sublayer 107, and temperature compensation sublayer 110 and the temperature compensation sublayer 107 may be in direct contact with each other. In this embodiment, the sidewalls of the protection layer 106, the temperature compensation sublayer 107, and the temperature compensation sublayer 110 are substantially aligned with each other in a direction perpendicular to the main surface of the piezoelectric substrate 100, and the sidewalls of these layers are covered by and in direct contact with the passivation layer 116, while the protection layer 109 is embedded in the temperature compensation sublayer 110 and has no sidewall aligned with the sidewalls of the above-mentioned layers and in contact with the passivation layer 116. The metal structure 108 and the protection layer 109 together constitute a clutter suppression structure CS1, that is, the clutter suppression structure CS1 is embedded in the temperature compensation layer TC1 and surrounded by the temperature compensation layer TC1. Other structural features of the surface acoustic wave resonator structure 500*b* are similar to those of the surface acoustic wave resonator structure 500*a*, which are not be described again here.

FIG. 3A to FIG. 3J are schematic views illustrating a method of forming a surface acoustic wave resonator structure according to some embodiments of the present disclosure.

Figure 3A:
FIG. 3A to FIG. 3K are schematic cross-sectional views illustrating a method of forming a surface acoustic wave resonator structure according to some embodiments of the present disclosure.

Referring to FIG. 3A, a piezoelectric substrate 100 is provided, and the piezoelectric substrate 100 includes a piezoelectric material with piezoelectric property, such as lithium niobate crystal, lithium tantalate crystal, or the like. In some embodiments, the piezoelectric substrate 100 may be a monocrystalline piezoelectric substrate, but the present disclosure is not limited thereto.

Figure 3B:
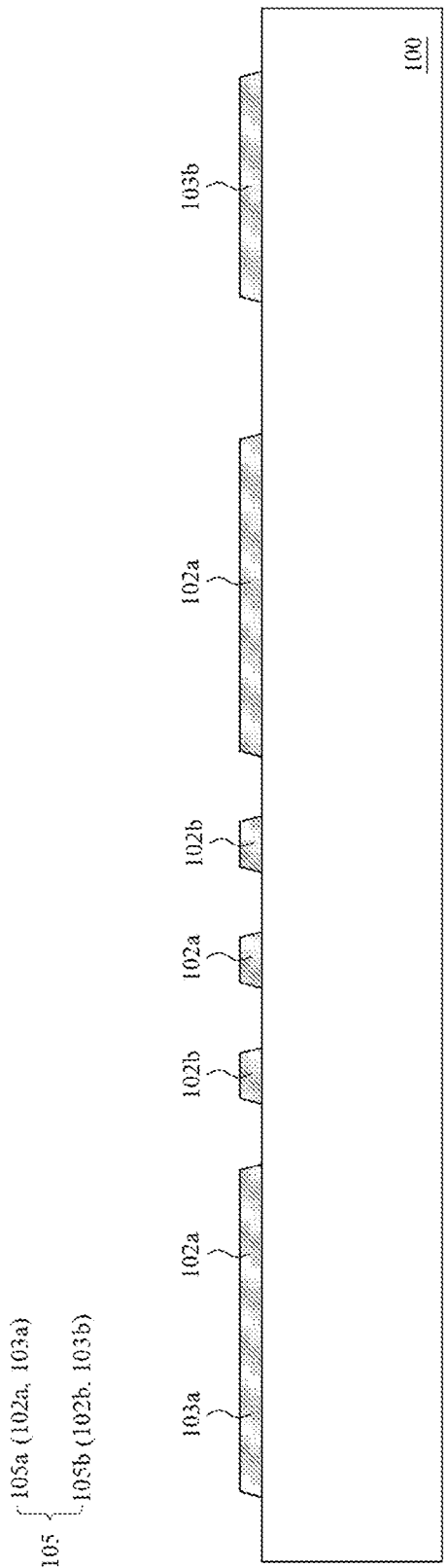

Referring to FIG. 1A and FIG. 3B, an interdigital transducer 105 including an interdigital electrode structure 105*a* and an interdigital electrode structure 105*b* is formed on the piezoelectric substrate 100. The interdigital electrode structure 105*a* includes a plurality of interdigital electrodes 102*a* and an interdigital electrode lead-out part 103*a* that are connected to each other; the interdigital electrode structure 105*b* includes a plurality of interdigital electrodes 102*b* and an interdigital electrode lead-out part 103*b* that are connected to each other. The material of the interdigital transducer 105 includes a metal or metal alloy, such as gold, silver, tungsten, titanium, platinum, aluminum, copper, molybdenum, the like, alloys thereof, or combinations thereof. In some embodiments, the method of forming the interdigital transducer 105 may include depositing a metal material layer on the piezoelectric substrate 100, and then performing a patterning process on the metal material layer to form the interdigital transducer 105 including the plurality of interdigital electrodes 102*a* and 102*b* and the interdigital electrode lead-out parts 103*a* and 103*b*. That is to say, the plurality of interdigital electrodes 102*a* and 102*b* and the interdigital electrode lead-out parts 103*a* and 103*b* are formed from the same metal material layer in the same patterning process. In some embodiments, the interdigital transducer 105 including the plurality of interdigital electrodes 102*a* and 102*b* and the interdigital electrode lead-out parts 103*a* and 103*b* may be referred to as a first metal layer. It should be understood that, although the respective interdigital electrodes and interdigital electrode lead-out parts are shown as having inclined sidewalls in the drawing, the present disclosure is not limited thereto, and the respective interdigital electrodes and the interdigital electrode lead-out parts may also have straight sidewalls, for example, substantially perpendicular to the main surface of the piezoelectric substrate 100.

Figure 3C:
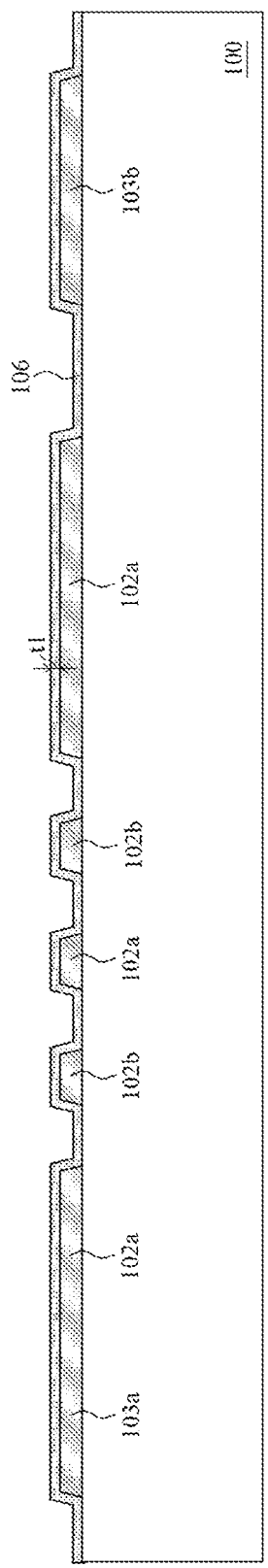

Referring to FIG. 3C, a protection layer 106 is formed on the piezoelectric substrate 100, and the protection layer 106 is located on the piezoelectric substrate 100 and extends along the main surface of the piezoelectric substrate 100, the sidewalls of the respective interdigital electrodes and interdigital electrode lead-out parts of the interdigital transducer 105 (i.e., the first metal layer) and the surface thereof at the side away from the piezoelectric substrate 100. In some embodiments, in this step, the protection layer 106 completely covers the sidewalls of the respective interdigital electrodes 102*a* and 102*b* and the interdigital electrode lead-out parts 103*a* and 103*b* and the surfaces thereof at the side away from the piezoelectric substrate 100. The material of the protection layer 106 includes, for example, a dielectric material, and may include a nitride, such as silicon nitride, aluminum nitride, the like, or combinations thereof. In some embodiments, the protection layer 106 may also be referred to as a first dielectric layer. For example, the protection layer 106 may be formed through a suitable deposition method, such as chemical vapor deposition (CVD), physical vapor deposition (PVD), atomic layer deposition (ALD), or the like. In some embodiments, the protection layer 106 does not include oxide materials such as silicon oxide, and during the forming process of the protection layer 106, there has no oxygen being introduced into the deposition chamber, thereby avoiding oxidation of the interdigital transducer 105 (i.e., first metal layer) caused by the forming process of the protection layer 106. In some embodiments, the thickness t1 of the protection layer 106 may be in a range from 2 nm to 50 nm; the thickness of the protection layer 106 is disposed to be above 2 nm, so that the protection layer 106 has a sufficient thickness to well protect the interdigital transducer during the subsequent process, and the thickness of the protection layer 106 is disposed to be within 50 nm, thereby avoiding the gap between the subsequent temperature compensation layer and the interdigital transducer from being too large, and further avoiding issues such as reduction of the temperature compensation performance of the resonator due to the gap being too large. In some embodiments, the protection layer 106 is a conformal layer, that is, having a substantially uniform thickness over the region along which the protection layer extends. However, the present disclosure is not limited thereto.

Figure 3D:
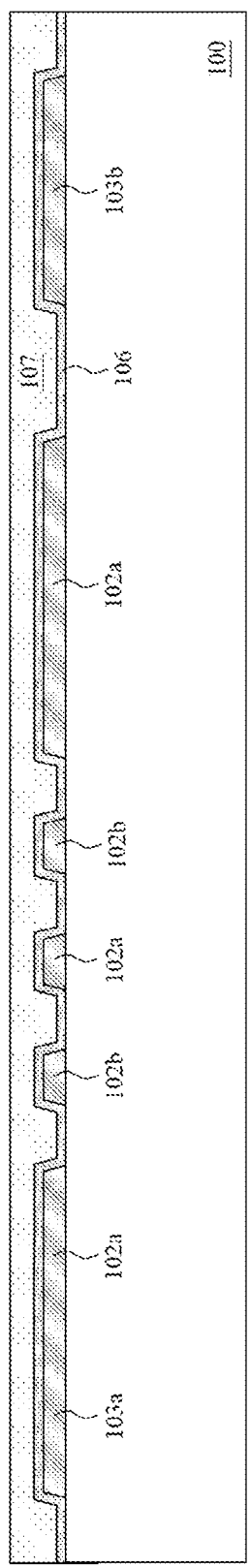

Referring to FIG. 3D, a temperature compensation sublayer 107 is formed on the protection layer 106. The material of the protection layer 106 is different from that of the temperature compensation sublayer 107. For example, the temperature compensation sublayer 107 includes a dielectric material, such as an oxide material, such as silicon oxide, or the like. In some embodiments, the temperature compensation sublayer 107 may also be referred to as a second dielectric layer. A dielectric material layer may be formed through a deposition process such as CVD, PVD, or the like, and a planarization process, such as a chemical mechanical polishing (CMP) process may then be performed on the dielectric material layer, so as to form the temperature compensation sublayer 107 with a substantially flat surface. For example, in an exemplary embodiment, the temperature compensation sublayer 107 may be or include a silicon oxide layer, and is deposited by a PVD process. During the PVD process, a silicon target is used as a sputtering target, and an appropriate amount of oxygen (O2) is introduced into the deposition chamber to deposit and form the silicon oxide layer. In this embodiment, since the protection layer 106 is formed before forming the temperature compensation sublayer 107, and the protection layer 106 completely covers the sidewalls of the interdigital transducer 105 (e.g., the first metal layer) and the surface of the interdigital transducer 105 at the side away from the piezoelectric substrate 100, during the process of forming the temperature compensation sublayer 107 (e.g., a silicon oxide layer), the protection layer 106 isolates the first metal layer from the introduced oxygen, so as to prevent the first metal layer from being oxidized, thereby avoiding issues such as degradation of device performance caused by oxidation of the first metal layer.

Figure 3E:
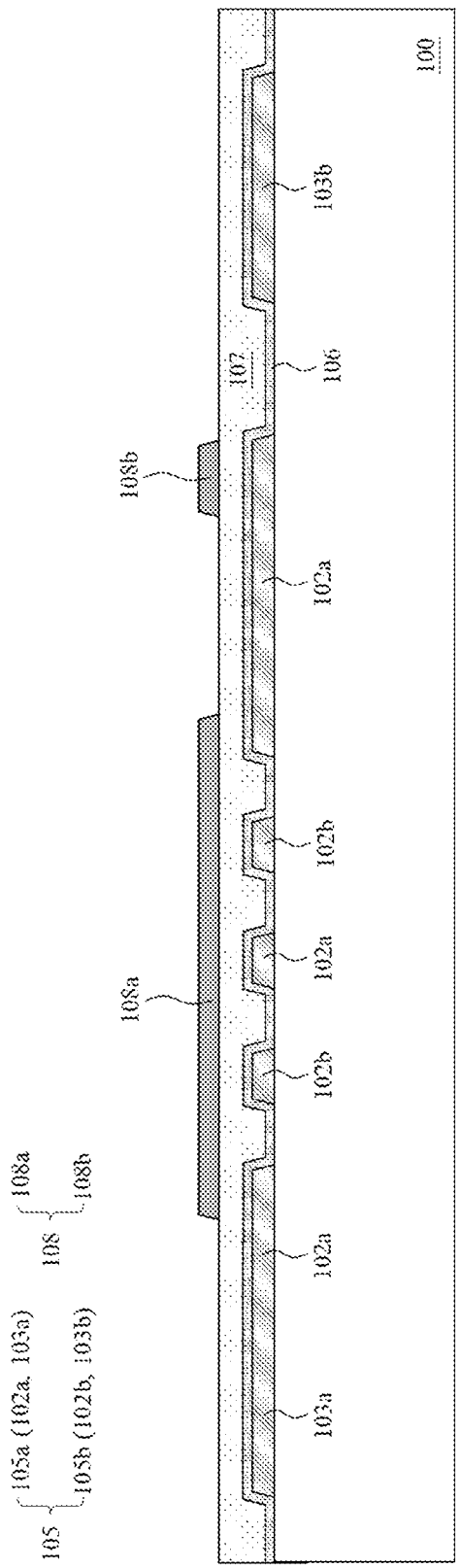

Referring to FIG. 1A and FIG. 3E, a metal structure 108 is formed on a side of the temperature compensation sublayer 107 away from the protection layer 106. In some embodiments, the metal structure 108 includes a metal strip 108a and a metal strip 108b, and the metal structure 108 is overlapped with the plurality of interdigital electrodes 102a and 102b in a direction perpendicular to the main surface of piezoelectric substrate 100. In some embodiments, the metal strip 108a is formed over the edges of the plurality of interdigital electrodes 102b and extends across the plurality of interdigital electrodes 102a and 102b, the metal strip 108b is formed over the edges of the plurality of interdigital electrodes 102a and extends across the plurality of interdigital electrodes 102a and 102b, and the edges of the metal strips 108a and 108b are respectively formed to be aligned with the corresponding edges of the interdigital electrodes 102b and 102a. In some embodiments, the metal structure 108 includes a metal material such as gold, tungsten, silver, titanium, platinum, aluminum, copper, molybdenum, the like, alloys thereof, or combinations thereof. The method of forming the metal structure 108 includes, for example, depositing a metal material layer on the temperature compensation sublayer 107, and performing a patterning process on the metal material layer to form the metal structure 108 including a plurality of metal strips 108a and 108b. In some embodiments, the metal structure 108 may also be referred to as a second metal layer.

Figure 3F:
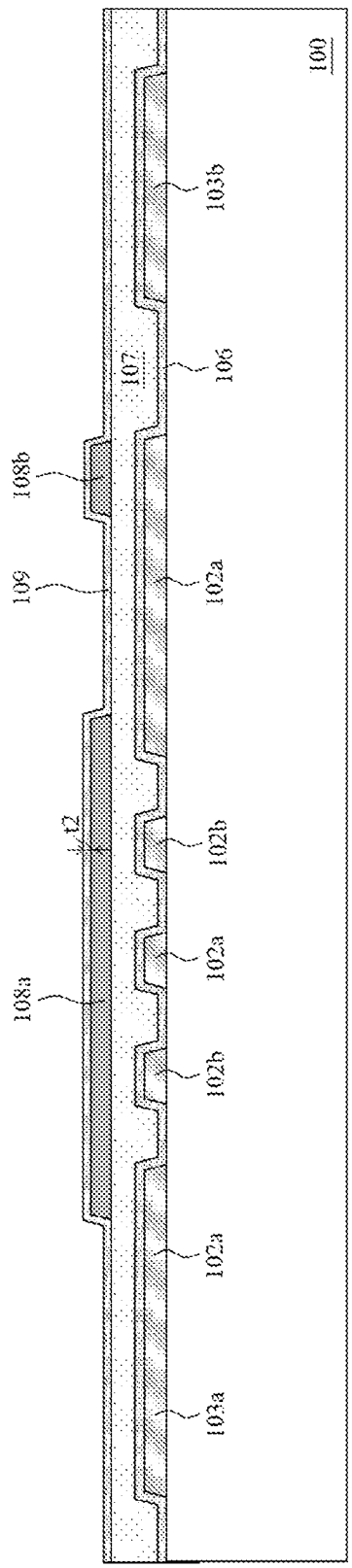

Referring to FIG. 3F, a protection layer 109 is then formed on the temperature compensation sublayer 107 and the metal structure 108, and the protection layer 109 extends along the surface of the temperature compensation sublayer 107 at the side away from the protection layer 106, the sidewalls of the metal structure 108 and the surface of the metal structure 108 at the side away from the temperature compensation sublayer 107. In some embodiments, the protection layer 109 completely covers the sidewalls of the metal structure 108 and the surface thereof at the side away from the temperature compensation sublayer 107. The material of the protection layer 109 is different from the material of the temperature compensation sublayer 107, and can be selected from the same candidate materials as those of the protection layer 106, and the material of the protection layer 109 may be the same as or different from that of the protection layer 106. For example, the protection layer 109 is a dielectric layer, and may include a dielectric material such as silicon nitride, aluminum nitride, the like, or combinations thereof. In some embodiments, the protection layer 109 does not include an oxide such as silicon oxide. The protection layer 109 may be deposited and formed by a deposition process such as CVD, PVD, ALD, or the like, and no oxygen is introduced into the deposition chamber during the forming process of the protection layer 109, so as to prevent the metal structure 108 from being oxidized during the forming process of the protection layer 109, and the protection layer 109 can protect the metal structure 108 from being damaged in the subsequent process. The protection layer 109 may be a conformal layer, and the thickness t2 of the protection layer 109 may be the same as or different from the thickness of the protection layer 106. In some embodiments, the thickness of the protection layer 109 needs to be set within an appropriate range, for example, the thickness of the protection layer 109 may be greater than a certain value, such that the protection layer 109 has a sufficient thickness to well protect the metal structure 108 in subsequent processes; and the thickness of the protection layer 109 may be less than a certain value, so as to avoid the gap between a subsequently formed temperature compensation sublayer 110 and the temperature compensation sublayer 107 being too large, thereby avoiding issues such as degradation of temperature compensation performance of the resonator that may be caused by the gap that is too large. For example, the thickness t2 of the protection layer 109 may range from 2 nm to 50 nm, but the disclosure is not limited thereto, and the thickness of the protection layer 109 can be appropriately adjusted according to product requirement. In some embodiments, the protection layer 109 may also be referred to as a third dielectric layer.

Figure 3G:
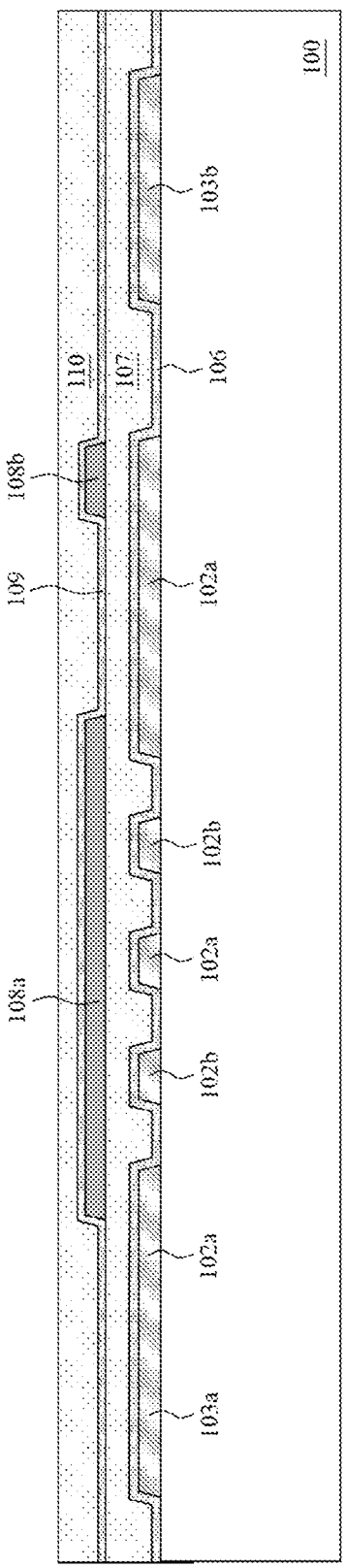

Referring to FIG. 3G, a temperature compensation sublayer 110 is formed on a side of the protection layer 109 away from the metal structure 108 and the temperature compensation sublayer 107. The material of the temperature compensation sublayer 110 is similar to, and may be the same as or different from that of the temperature compensation sublayer 107, and is different from the materials of the protection layers 106 and 109. For example, the temperature compensation sublayer 110 is a dielectric layer and may include a dielectric material such as silicon oxide. The method of forming the temperature compensation sublayer 110 is similar to that of the temperature compensation sublayer 107. For example, a silicon oxide layer may be formed by a PVD process using a silicon target, with oxygen being introduced during the deposition process, and a planarization process (e.g., CMP) may be performed on the silicon oxide layer, so as to form the temperature compensation sublayer 110 with a substantially flat surface. In this embodiment, since the protection layer 109 is formed before forming the temperature compensation sublayer 110, and the protection layer 109 completely covers the metal structure 108 (i.e., the second metal layer), during the process of forming the temperature compensation sublayer 110 (e.g., silicon oxide layer), the protection layer 109 isolates the metal structure 108 from the introduced oxygen, thereby protecting the metal structure 108 from being oxidized, such that the clutter suppression structure including the metal structure 108 has good clutter suppression ability, thereby improving the performance of the resonator.

Figure 3H:
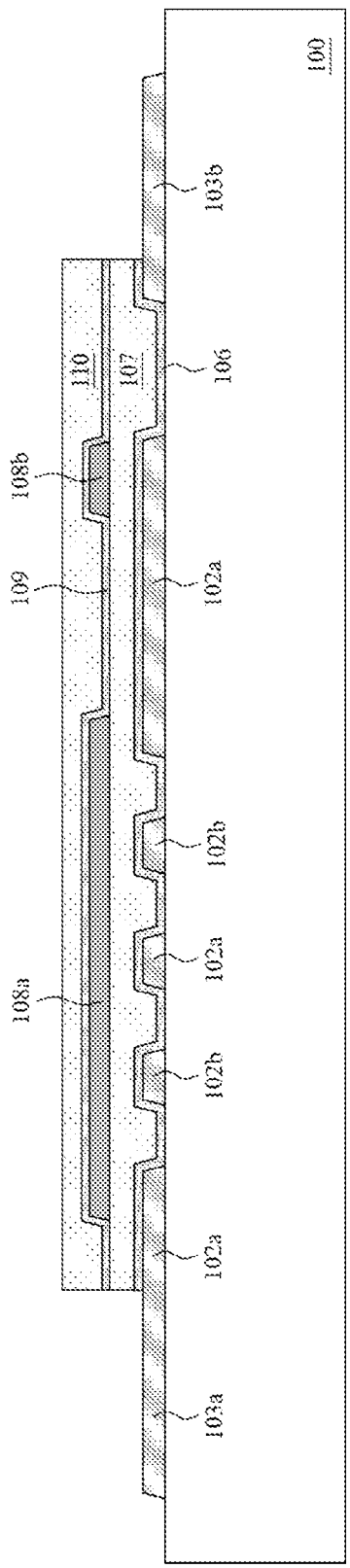

Referring to FIG. 3G to FIG. 3H, an etching process is performed on the temperature compensation sublayer 110, the protection layer 109, the temperature compensation sublayer 107 and the protection layer 106, so as to remove portions of the temperature compensation sublayer 110, the protection layer 109, the temperature compensation sublayer 107 and the protection layer 106, and at least expose portions of the surfaces of the interdigital electrode lead-out parts 103a and 103b at the side away from the piezoelectric substrate 100. In some embodiments, portions of the temperature compensation sublayers 110 and 107 and the protection layers 109 and 106 located on the edge of the piezoelectric substrate 100 and portions of the temperature compensation sublayers 110 and 107 and the protection layers 109 and 106 located on at least portions of the interdigital electrode lead-out parts 103a and 103b are removed. In some embodiments, after the etching process, the sidewalls of the temperature compensation sublayers 110 and 107 and the protection layers 109 and 106 are substantially aligned in a direction perpendicular to the main surface of the piezoelectric substrate 100.

Figure 3I:
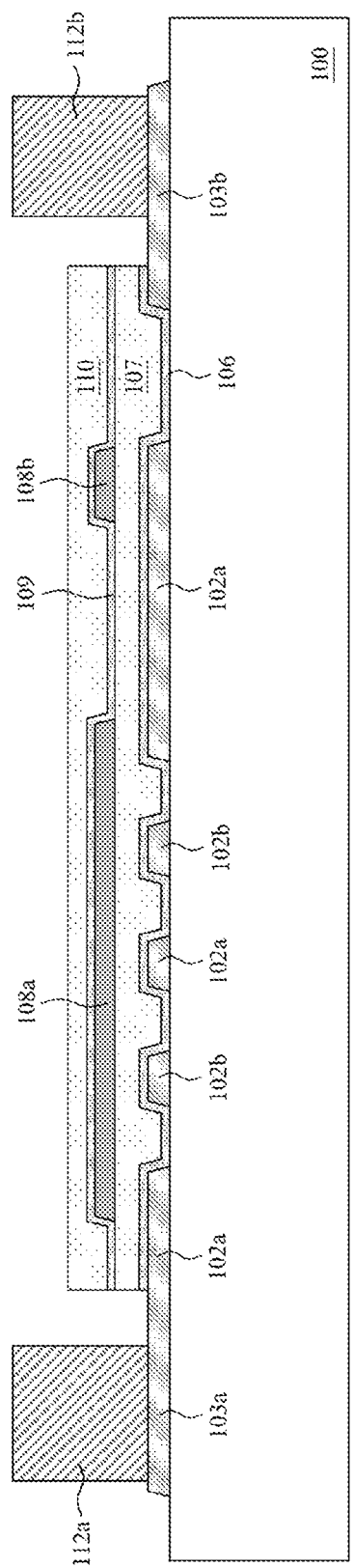

Referring to FIG. 3I, conductive connectors 112a and 112b are respectively formed on the exposed portions of the interdigital electrode lead-out parts 103a and 103b. The conductive connectors 112a and 112b are electrically connected to the interdigital electrode lead-out parts 103a and 103b, and are electrically connected to the corresponding interdigital electrodes 102a and 102b through the interdigital electrode lead-out parts 103a and 103b, respectively. In the direction perpendicular to the main surface of the piezoelectric substrate 100, the conductive connectors 112a and 112b are at least partially overlapped with the corresponding interdigital electrode lead-out parts 103a and 103b. The materials of the conductive connectors 112a and 112b may be selected from the same candidate materials as the first metal layer, and may be the same as or different from the material of the first metal layer. In some embodiments, the conductive connectors 112a and 112b may also be referred to as a third metal layer, and the method of forming the conductive connectors 112a and 112b may include a deposition process such as PVD and a patterning process.

Figure 3J:
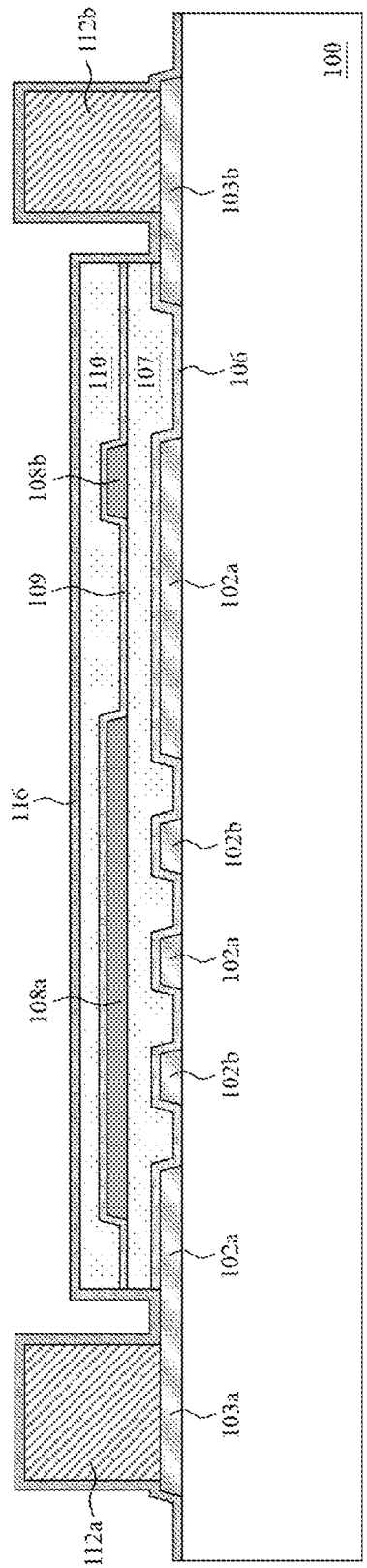

Referring to FIG. 3J, thereafter, a passivation layer 116 is formed over the piezoelectric substrate 100 to cover the plurality of components formed on the main surface of the piezoelectric substrate 100. In some embodiments, the material of the passivation layer 116 may be different from the materials of the temperature compensation sublayers 110 and 107, and may be the same or different from the materials of the protection layers 106 and 109. For example, the material of the passivation layer 116 may include a dielectric material such as silicon nitride, aluminum nitride, the like, or combinations thereof. In some embodiments, the passivation layer 116 may also be referred to as a fifth dielectric layer.

Figure 3K:
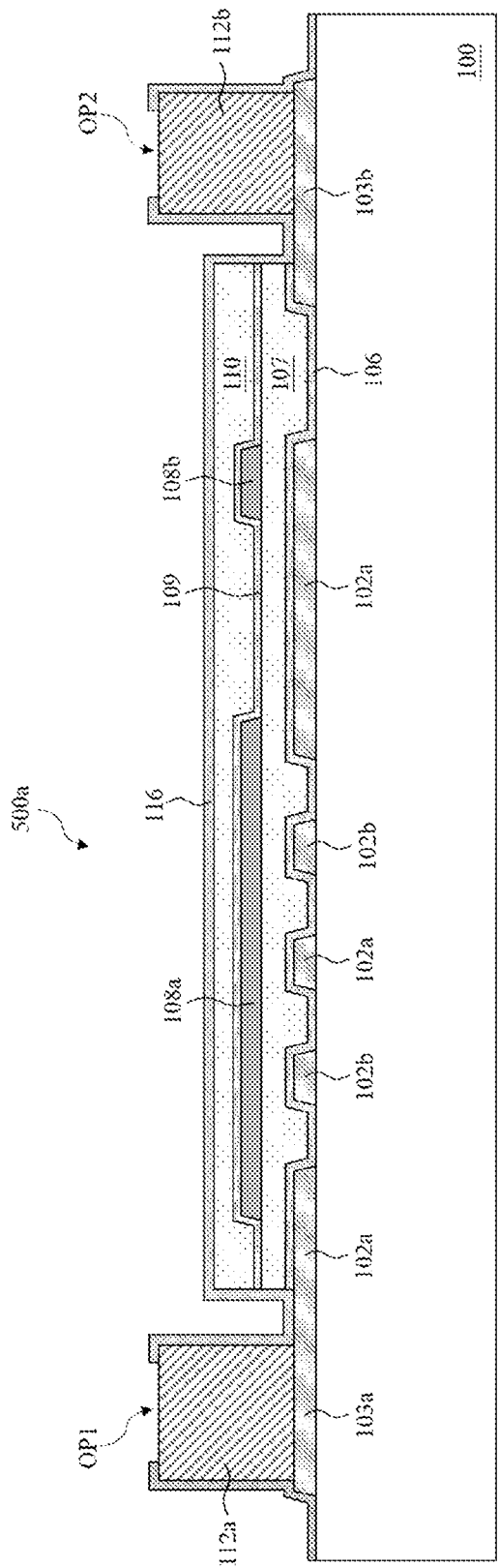

Referring to FIG. 3J and FIG. 3K, in some embodiments, a patterning process is performed on the passivation layer 116 to remove portions of the passivation layer 116, and form openings OP1 and OP2 in the passivation layer 116. The openings OP1 and OP2 respectively expose portions of the surfaces of the conductive connectors 112a and 112b at the side away from the interdigital electrode lead-out parts 103a and 103b for external connection.

Referring to FIG. 3K, as such, the surface acoustic wave resonator structure 500a is thus formed. During the process of forming the surface acoustic wave resonator structure 500a, since the protection layers are respectively formed before forming the temperature compensation sublayers on the first metal layer and the second metal layer, the protection layers can protect the first metal layer and the second metal layer, for example, the protection layers can prevent the first metal layer and the second metal layer from being oxidized during the process of forming the temperature compensation sublayers or being oxidized by oxygen in the environment, thereby improving the device performance of the formed surface acoustic wave resonator structure 500a. On the other hand, forming the clutter suppression structure including the second metal layer can suppress the formation and/or propagation of clutter wave and avoid energy loss, thereby improving the performance of the resonator.

In the above description, the surface acoustic wave resonator structure 500a is taken as an example to illustrate the forming method of the surface acoustic wave resonator structure in the embodiments of the present disclosure. The forming method of the surface acoustic wave resonator structure 500b (FIG. 2A to FIG. 2C) is similar to that of the surface acoustic wave resonator structure 500a, the difference lies in that: during the process of forming the surface acoustic wave resonator structure 500b, after forming the protection layer 109 as illustrated in FIG. 3F and before forming the temperature compensation sublayer 110 as illustrated in FIG. 3G, the process further includes: performing a patterning process on the protection layer 109 to remove portions of the protection layer 109 covering and contacting the temperature compensation sublayer 107, and at least remaining portions of the protection layer 109 covering the metal structure 108, such that the sidewalls of the metal structure 108 and the surface of the metal structure 108 at the side away from the temperature compensation sublayer 107 is covered (e.g., completely covered) by the remaining portions of the protection layer 109, such that the protection layer 109 can protect the metal structure 108 from being oxidized in subsequent processes. In this way, as shown in FIG. 2A to FIG. 2C, a portion of the subsequently formed temperature compensation sublayer 110 would be in direct contact with the temperature compensation sublayer 107; and in the process steps of FIG. 3G to FIG. 3H, portions of the temperature compensation sublayer 110, the temperature compensation sublayer 107 and the protection layer 106 are etched and removed; the other process steps for forming the surface acoustic wave resonator structure 500b are similar to those of the surface acoustic wave resonator structure 500a, which are not described again here.

Figure 4A:
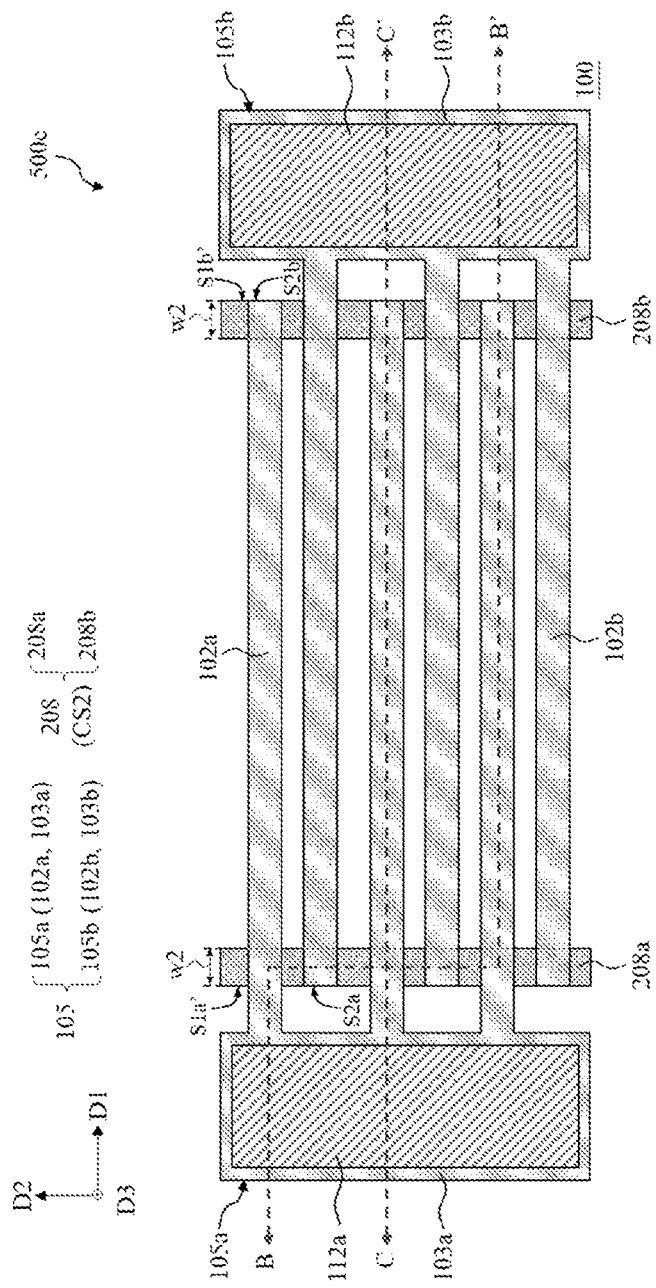
FIG. 4A illustrates a schematic top view of a surface acoustic wave resonator structure according to some other embodiments of the present disclosure.
Figure 4B:
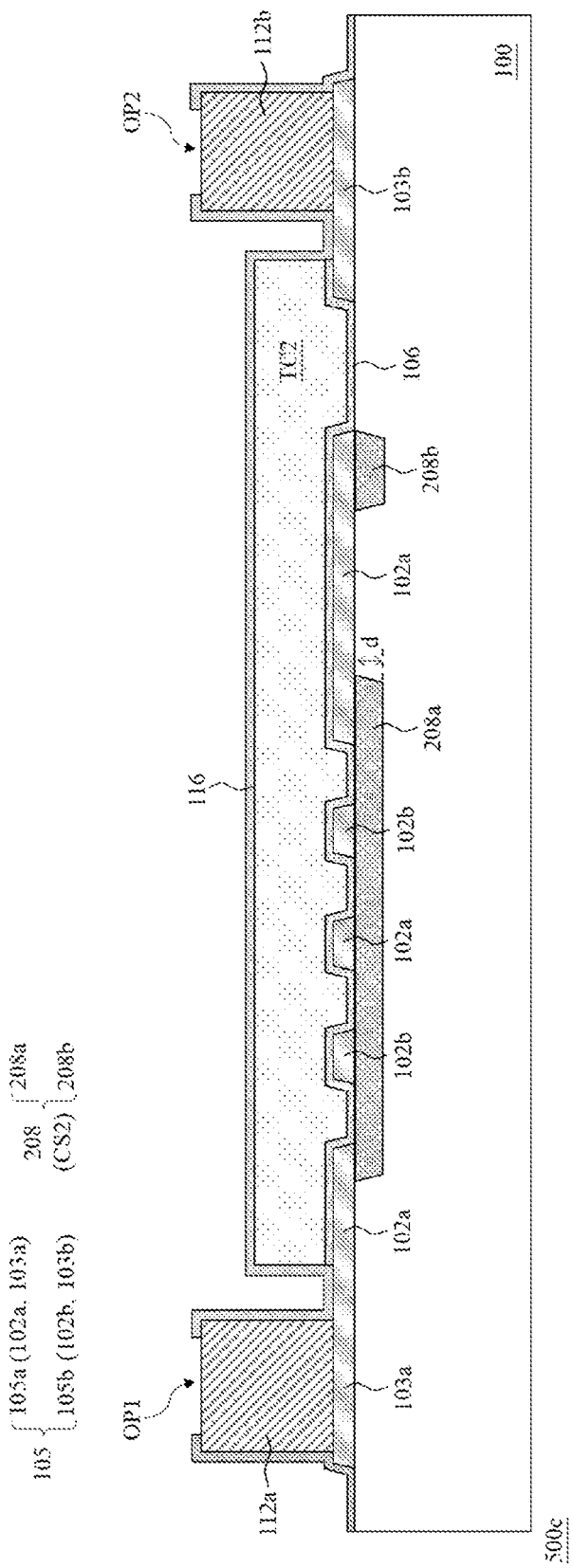
FIG. 4B and FIG. 4C illustrate schematic cross-sectional views of the surface acoustic wave resonator structure according to some other embodiments of the present disclosure.
Figure 4C:
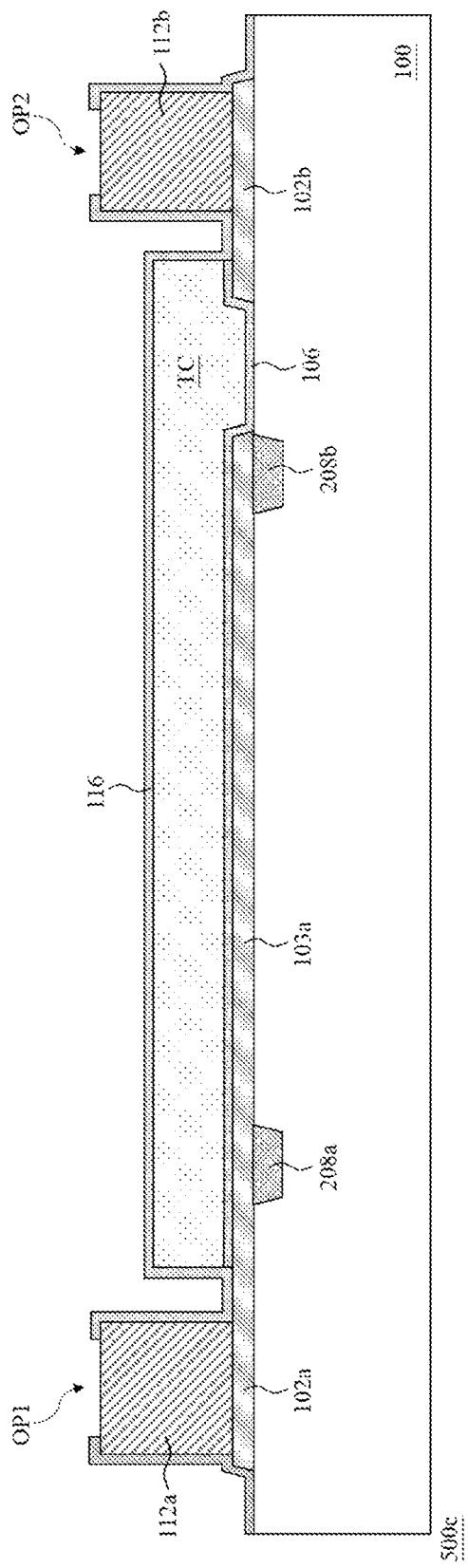

FIG. 4A illustrates a schematic top view of a surface acoustic wave resonator structure according to some other embodiments of the present disclosure; FIG. 4B and FIG. 4C illustrate schematic cross-sectional views of the surface acoustic wave resonator structure according to some other embodiments of the present disclosure; FIG. 4B and FIG. 4C are cross-sectional views respectively taken along the line B-B' and the line C-C' of FIG. 4A. The surface acoustic wave resonator structure 500c illustrated in FIG. 4A to FIG. 4C is similar to that described in the foregoing embodiment, and the difference lies in that, in this embodiment, the clutter suppression structure does not adopt a metal layer and a protection layer, instead, an ion implantation is performed on the piezoelectric substrate to form a doped structure serving as a clutter suppression structure. The differences between the surface acoustic wave resonator structure 500c and that of the foregoing embodiment will be described in detail below, and structural features of the surface acoustic wave resonator structure 500c similar to the surface acoustic wave resonator structures of the foregoing embodiments are not described again here.

Referring to FIG. 4A to FIG. 4C, in some embodiments, in the surface acoustic wave resonator structure 500c, the clutter suppression structure CS includes a doped structure 208 disposed in the piezoelectric substrate 100, the doped structure 208 includes a doped region 208a and a doped region 208b, the doped region 208a and the doped region 208b respectively serve as the first clutter suppression layer and the second clutter suppression layer of the clutter suppression structure CS, or vice versa. For example, the doped regions 208a and 208b may include doping ions such as helium ions, hydrogen ions, or the like. For example, the doped regions 208a and 208b extend from the main surface of the piezoelectric substrate 100 close to the interdigital transducer into the piezoelectric substrate 100, and the surfaces of the doped regions 208a and 208b at the side close to the interdigital transducer 105 may be substantially level with the main surface of the piezoelectric substrate 100, and may be in direct contact with portions of the surfaces of the interdigital electrodes 102a and 103a close to the piezoelectric substrate 100. In some embodiments, the doped regions 208a and 208b extend substantially parallel to each other along a direction D2 perpendicular to the extending direction of the interdigital electrodes 102a and 102b, and the doped region 208a and 208b are arranged along the direction D1. The doped region 208a and the doped region 208b are disposed on a side of the plurality of interdigital electrodes 102a and 102b close to the piezoelectric substrate 100, extending across the plurality of interdigital electrodes 102a and 102b in the direction D2, and are respectively overlapped with the plurality of interdigital electrodes 102a and 102b in a direction (e.g., the direction D3) perpendicular to the main surface of the piezoelectric substrate 100; that is, in the direction perpendicular to the main surface of the piezoelectric substrate 100, the orthographic projections of the plurality of interdigital electrodes 102a and 102b on the main surface of the piezoelectric substrate 100 are respectively overlapped (e.g., partially overlapped) with the doped regions 208a and 208b of the piezoelectric substrate 100.

In some embodiments, the extending direction and arrangement direction of the doped regions 208a and 208b and their overlapping relationship with the interdigital electrodes 102a and 102b may be similar to those described with respect to the metal strips 108a and 108b in the foregoing embodiments. In some embodiments, the doped region 208a is located at the side of the plurality of interdigital electrodes 102a and 102b close to the piezoelectric substrate 100, and extends across the plurality of interdigital electrodes 102a and 102b, and the doped region 208a is located below the ends of the interdigital electrodes 102b away from the interdigital electrode lead-out part 103b and close to the interdigital electrode lead-out part 103a (i.e., located at a side of the ends of the interdigital electrodes 102b close to the piezoelectric substrate 100); for example, the doped region 208a has sidewalls (or edges) opposite to each other in the direction D1 parallel to the main surface of the piezoelectric substrate 100, and the sidewall (or edge) S1a' of the doped region 208a away from the interdigital electrode lead-out part 103b and close to the interdigital electrode lead-out part 103a may be substantially aligned with the sidewall (or the edge) S2a of the interdigital electrode 102b away from the interdigital electrode lead-out part 103b and close to the interdigital electrode lead-out part 103a in the direction D3 perpendicular to the main surface of the piezoelectric substrate 100. Similarly, the doped region 208b is located at the side of the plurality of interdigital electrodes 102a and 102b close to the piezoelectric substrate 100, and extends across the plurality of interdigital electrodes 102a and 102b, and the doped region 208b is located below the ends of the interdigital electrodes 102a away from the interdigital electrode lead-out part 103a and close to the interdigital electrode lead-out part 103b (i.e., located at a side of the ends of the interdigital electrodes 102a close to the piezoelectric substrate 100); for example, the doped region 208b has sidewalls (or edges) opposite to each other in the direction D1 parallel to the main surface of the piezoelectric substrate 100, and the sidewall (or edge) S1b' of the doped region 208b away from the interdigital electrode lead-out part 103a and close to the interdigital electrode lead-out part 103b may be substantially aligned with the sidewall (or the edge) S2b of the interdigital electrode 102a away from the interdigital electrode lead-out part 103a and close to the interdigital electrode lead-out part 103b in the direction D3 perpendicular to the main surface of the piezoelectric substrate 100. It should be understood that, although the sidewalls of the doped regions 208a and 208b and the interdigital electrodes are shown as inclined, the present disclosure is not limited thereto. In some other embodiments, the sidewalls of the doped regions 208a and 208b and the interdigital electrodes may be straight, and may be substantially perpendicular to the main surface of the piezoelectric substrate 100. In addition, in some embodiments, the sidewalls of first and second clutter suppression layers may also be slightly offset from, instead of being completely aligned with, the corresponding sidewalls of the interdigital electrodes.

Still referring to FIG. 4A to FIG. 4C, during the operation of the surface acoustic wave resonator structure 500c, the surface acoustic wave propagates along the arrangement direction (e.g., the direction D2) of the plurality of interdigital electrodes 102a and 102b of the interdigital transducer 105; in the case that there may exist clutter wave propagating along the direction D1, in this embodiment, through forming the doped regions 208a and 208b in the piezoelectric substrate 100, the propagation velocity of the surface acoustic wave along the direction D1 in the region of the piezoelectric substrate 100 between the doped region 208a and the doped region 208b can be changed (e.g., reduced), thereby suppressing the propagation of the clutter transverse wave in the direction D1, and reducing energy loss, and thus improving the performance of the resonator and filter. In the direction D2, there has no region in the piezoelectric substrate 200 confined between the doped regions, and therefore, the surface acoustic wave propagating along the direction D2 would not be affected.

In some embodiments, the widths of the doped regions 208a and 208b need to be disposed within appropriate ranges, and the widths of the doped regions need to be greater than a certain value, so that the doped regions 208a and 208b can effectively suppress the formation and propagation of clutter wave, and the widths of the doped regions need to be less than a certain value, so as to avoid the obvious reduction of effective area of the resonator due to the area occupied by the doped regions being too large, so as to balance the impact on the performance of the resonator device. For example, the range of the widths w2 of the doped regions 208a and 208b is similar to that of the metal structure in the foregoing embodiments, such as, in the range from 0.5 μm to 10 μm, but the embodiment of the present disclosure is not limited thereto. The thicknesses of the doped regions 208a and 208b may be appropriately adjusted according to product requirement. In some embodiments, the depths (i.e., thicknesses) d of the doped regions 208a and 208b may be set according to the thickness of the piezoelectric layer required by the resonator, for example, may be in a range of within 3 μm, but the present disclosure is not limited thereto.

Still referring to FIG. 4A to FIG. 4C, similar to the foregoing embodiments, a protection layer 106 is disposed on the piezoelectric substrate 100 and on the side of the interdigital transducer 105 (e.g., the plurality of interdigital electrodes 102a and 102b) away from the piezoelectric substrate 100, and a temperature compensation layer TC2 is disposed on a side of the protection layer 106 away from the interdigital transducer 105 and the piezoelectric substrate 100. In this embodiment, since the doped regions 208a and 208b serve as the clutter suppression structure, the metal structure 108 can be omitted. In some embodiments, both the protection layer 106 and the temperature compensation layer TC2 may be single-layer structures, and the protection layer 106 extends along the main surface of the piezoelectric substrate 100, the sidewalls of the interdigital transducer 105 (e.g., the plurality of interdigital electrodes 102a and 102b thereof) and the surface of the interdigital transducer 105 at the side away from the piezoelectric substrate 100, and extend to cover the surfaces of the doped regions 208a and 208b. In other words, the protection layer 106 is disposed at least between the interdigital transducer 105 and the temperature compensation layer TC2 to separate the interdigital transducer 105 apart from the temperature compensation sublayer TC2, so as to avoid the interdigital transducer 105 from being oxidized, for example, during the process of forming the temperature compensation layer TC2; in some embodiments, the protection layer 106 is further sandwiched between the piezoelectric substrate 100 and the temperature compensation layer TC2, and between the doped regions 208a and 208b and the temperature compensation layer TC2, so as to separate the piezoelectric substrate 100 and the doped regions 208a and 208b apart from the temperature compensation layer TC2.

In some embodiments, the sidewalls of the temperature compensation layer TC2 and corresponding sidewalls of the protection layer 106 are substantially aligned with each other in a direction perpendicular to the main surface of the piezoelectric substrate 100, and are covered by the passivation layer 116.

FIG. 5A to FIG. 5F are schematic cross-sectional views illustrating a method of forming a surface acoustic wave resonator structure 500c according to some embodiments of the present disclosure.

Figure 5A:
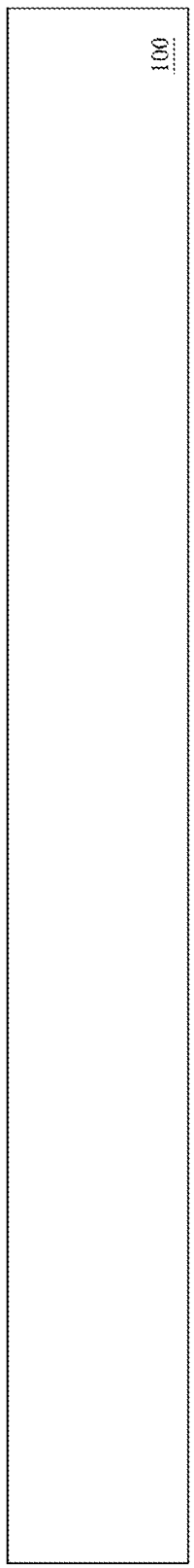
FIG. 5A to FIG. 5F are schematic cross-sectional views illustrating a method of forming a surface acoustic wave resonator structure according to some other embodiments of the present disclosure.

Referring to FIG. 5A, in some embodiments, a piezoelectric substrate 100 is provided, and the material of the piezoelectric substrate 100 is the same as that of the foregoing embodiments, and the details are not described again here.

Figure 5B:
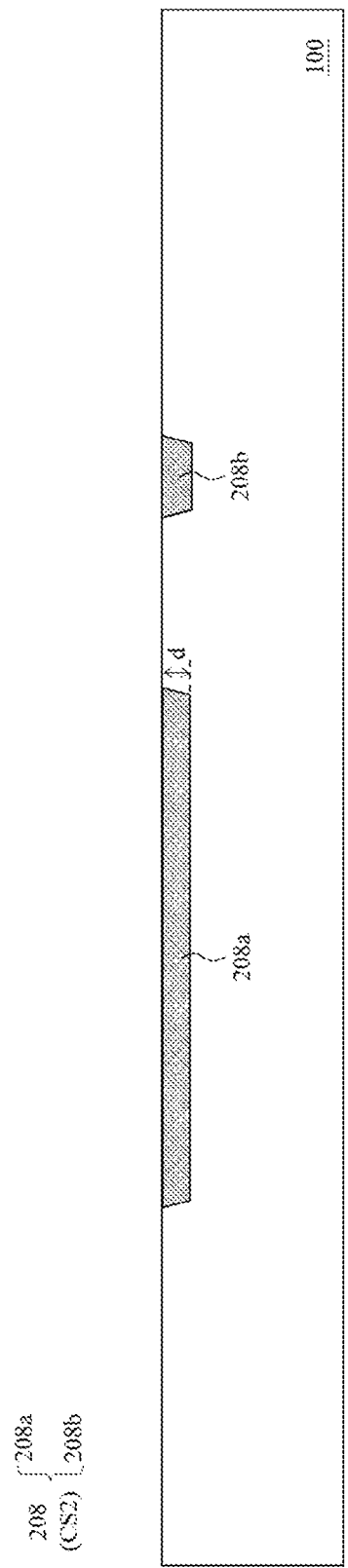

Referring to FIG. 5B, in some embodiments, an ion implantation process is performed on the piezoelectric substrate 100, for example, hydrogen ions, helium ions, or the like are implanted into the piezoelectric substrate 100 to form a doped region 208a and a doped region 208b in the piezoelectric substrate 100. The doped regions 208a and 208b extend from the main surface of the piezoelectric substrate 100 into the piezoelectric substrate 100, the depth d of the doped regions 208a and 208b may be adjusted by controlling the energy of the ion implantation process. In some embodiments, the doped regions 208a and 208b may also be referred to as a first doped region and a second doped region, and together constitute a clutter suppression structure CS2.

Figure 5C:
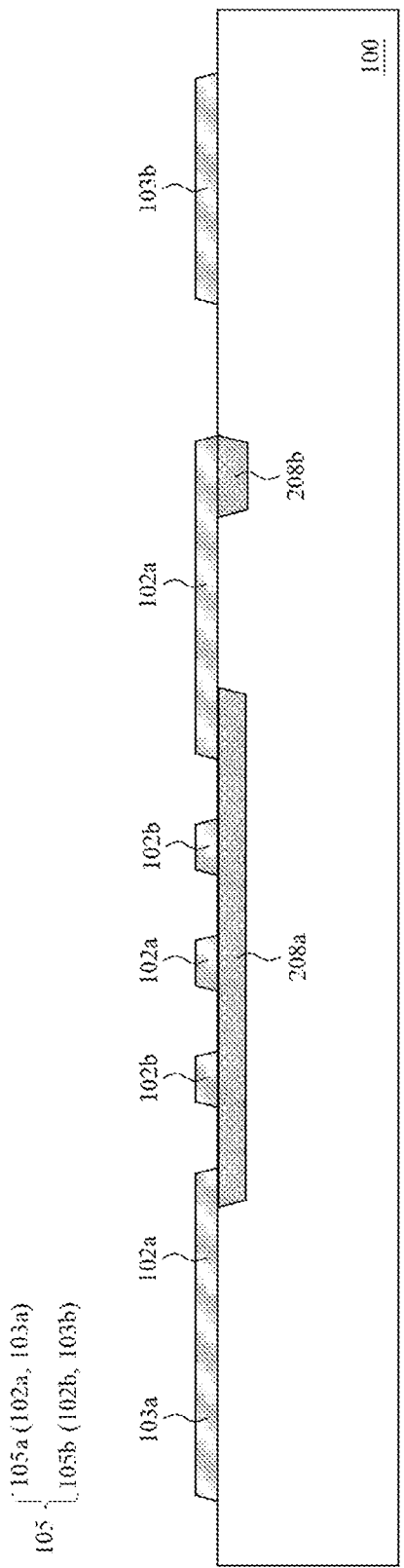

Referring to FIG. 4A and FIG. 5C, an interdigital transducer 105 is formed on the piezoelectric substrate 100 having doped regions 208a and 208b, the material and forming method of the interdigital transducer 105 are the same as those described with respect to FIG. 3B, which are not described again here. In some embodiments, in the process of forming the interdigital transducer 105, the sidewalls S2a and S2b of the interdigital electrodes 102b and 102a are formed to be substantially aligned with the corresponding sidewalls of the doped regions 208a and 208b in the direction perpendicular to the main surface of the piezoelectric substrate 100.

Figure 5D:
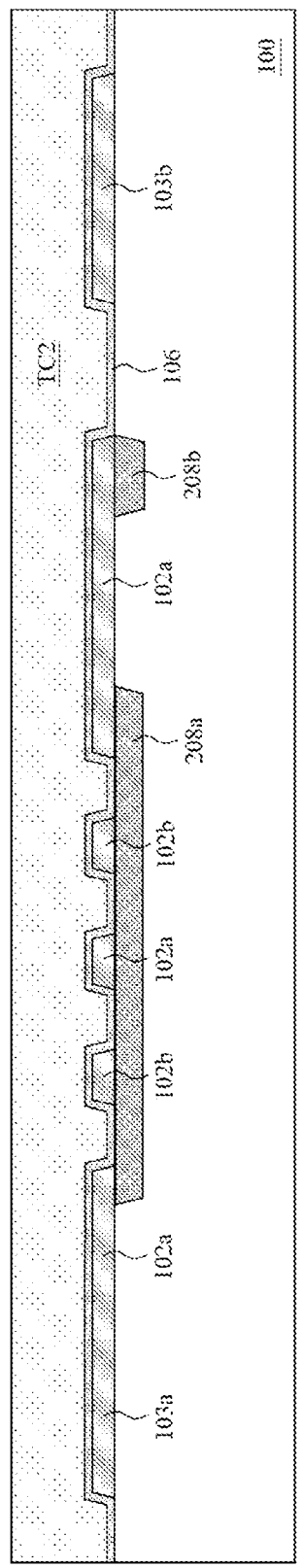

Referring to FIG. 5D, a protection layer 106 is formed on the main surface of the piezoelectric substrate 100 to at least cover (e.g., completely cover) the sidewalls of the respective interdigital electrodes 102a and 102b and interdigital electrode lead-out parts 103a and 103b of the interdigital transducer 105 and the surfaces thereof at the side away from the piezoelectric substrate 100. In some embodiments, the protection layer 106 continuously extends over the piezoelectric substrate 100, and further covers the main surface of the piezoelectric substrate 100 and the surfaces of the doped regions 208a and 208b. Thereafter, a temperature compensation layer TC2 is formed on a side of the protection layer 106 away from the interdigital transducer and the piezoelectric substrate 100.

Figure 5E:
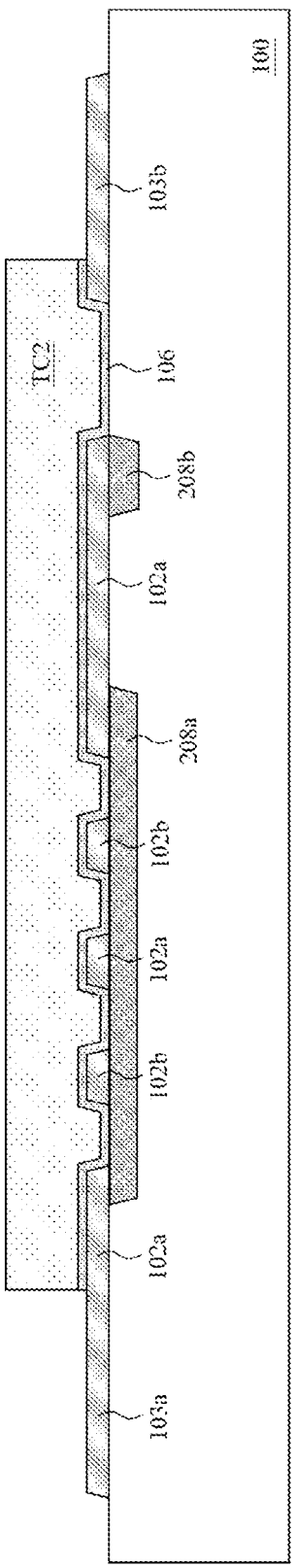

Referring to FIG. 5D and FIG. 5E, an etching process is performed on the temperature compensation layer TC2 and the protection layer 106 to remove some portions of the temperature compensation layer TC2 and the protection layer 106, so as to at least expose portions of the interdigital electrode lead-out parts 103a and 103b.

Figure 5F:
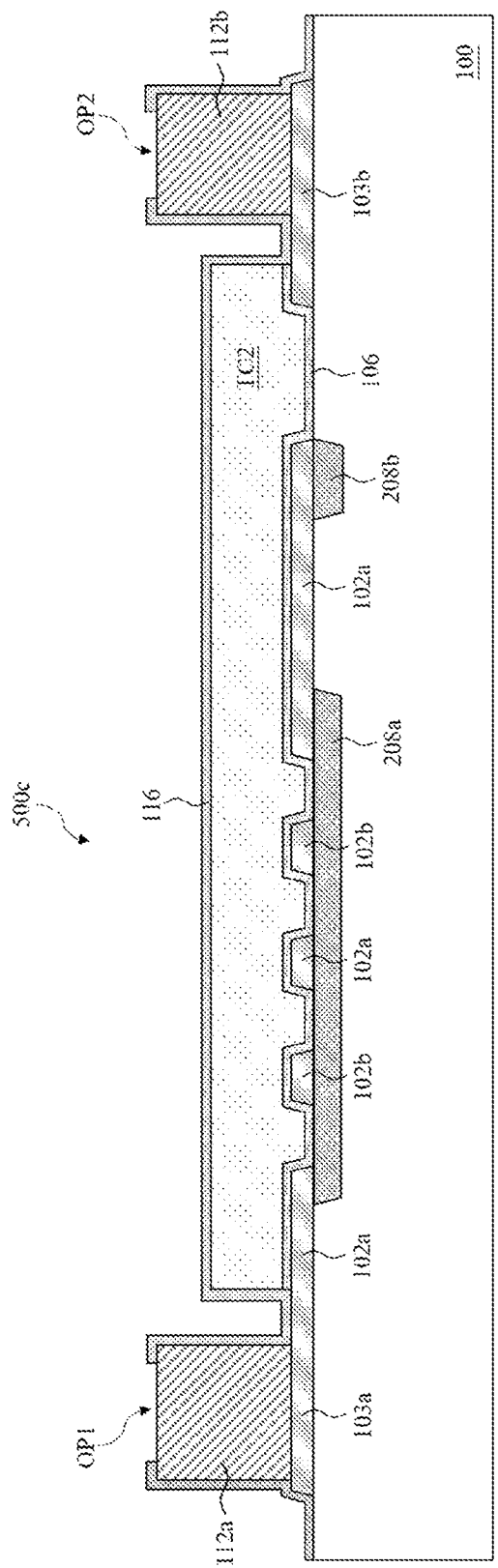

Referring to FIG. 5F, processes similar to those described with respect to FIG. 3I to FIG. 3K are then performed to form conductive connectors 112a and 112b on the exposed portions of the interdigital electrode lead-out parts 103a and 103b, and then form a passivation layer 116, and form openings OP1 and OP2 in the passivation layer 116 to provide external connection windows.

Figure 6A:
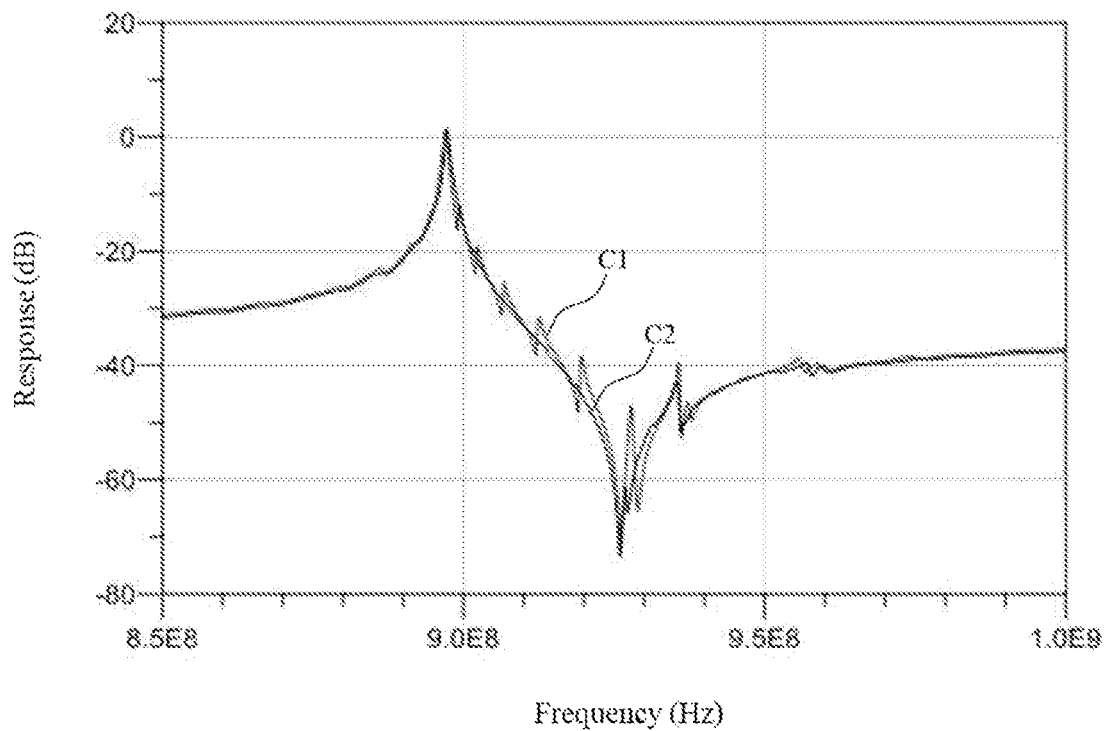
FIG. 6A and FIG. 6B illustrate frequency response curves of a conventional surface acoustic wave resonator structure without a clutter suppression structure and a surface acoustic wave resonator structure with a clutter suppression structure according to the embodiments of the present disclosure.
Figure 6B:
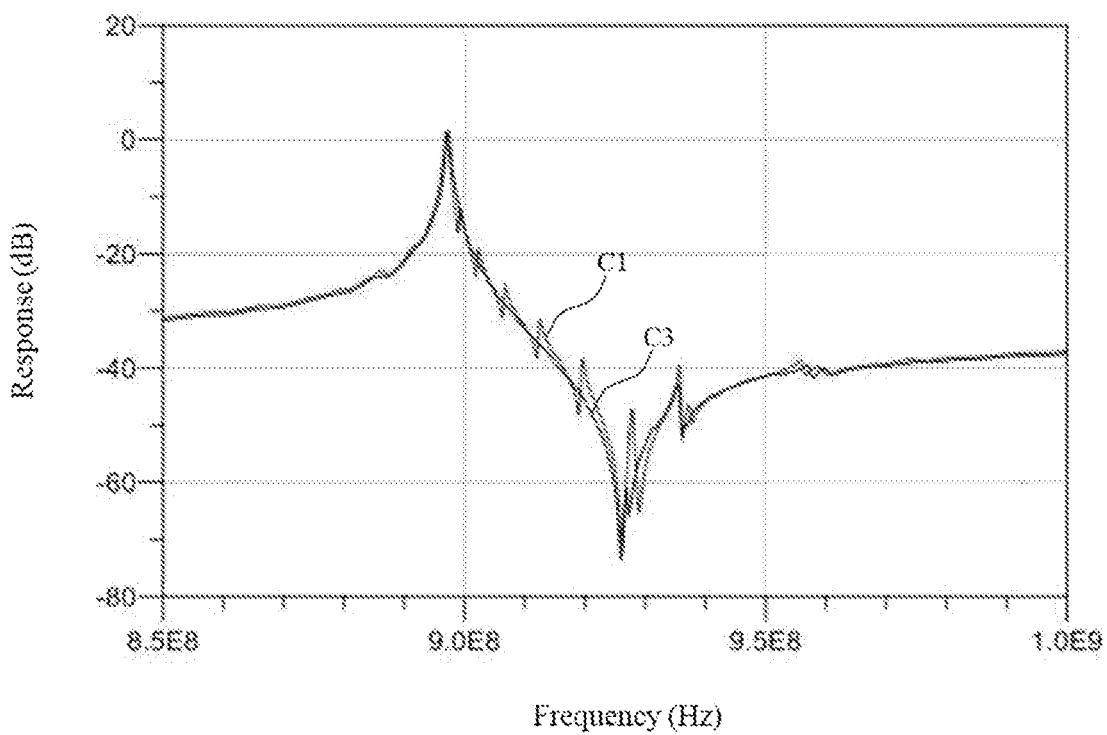

FIG. 6A and FIG. 6B illustrate frequency response curves of a conventional surface acoustic wave resonator structure without clutter suppression structure and a surface acoustic wave resonator structure with clutter suppression structure according to the embodiments of the present disclosure.

Referring to FIG. 6A, FIG. 6A illustrates a frequency response curve C1 of a conventional surface acoustic wave resonator structure without a clutter suppression structure and a frequency response curve C2 of the surface acoustic wave resonator structure 500a, 500b with the clutter suppression structure CS1 according to the embodiments of the present disclosure. It should be understood that, the more the spurious peaks in the frequency response curve, the more clutter wave the resonator has, and the smoother the frequency response curve is, the less clutter wave the resonator has. Comparing the curves C1 and C2, it can be seen that the frequency response curve C1 of the traditional resonator has multiple spurious peaks, that is, there exists much clutter wave in spurious modes; while the frequency response curve C2 of the surface acoustic wave resonator structure 500a, 500b is smooth and has no obvious spurious peak, this is because the clutter suppression structure CS1 is disposed, which suppresses the formation and/or propagation of clutter wave, as such, the energy loss can be avoided and the performance of the resonator can be improved.

Referring to FIG. 6B, FIG. 6B illustrates a frequency response curve C1 of a conventional surface acoustic wave resonator structure without a clutter suppression structure and a frequency response curve C3 of the surface acoustic wave resonator structure 500c with the clutter suppression structure CS2 according to the embodiment of the disclosure. As illustrated in the frequency response curve C3, the frequency response curve C3 of the surface acoustic wave resonator structure 500c is smooth and has no obvious spurious peak, this is because the clutter suppression structure CS2 is disposed, which suppresses the formation and/or propagation of clutter wave, as such, the energy loss can be avoided and the performance of the resonator can be improved.

It should be understood that, although the surface acoustic wave resonator structures 500a-500c described in the above embodiments include one of the metal structure 108 and the doped structure 208 as a clutter suppression structure, the present disclosure is not limited thereto. In some other embodiments, the surface acoustic wave resonator structure may include a metal structure 108 and a protection layer 109 disposed on the side of the interdigital transducer away from the piezoelectric substrate, as well as a doped structure 208 disposed on a side of the interdigital transducer close to the piezoelectric substrate and located in the piezoelectric substrate, the metal structure 108 and the doped structure 208 together constitute a clutter suppression structure to better suppress the formation and/or propagation of clutter wave, thereby avoiding energy loss and improving the device performance of the resonator.

The embodiments of the present disclosure further provide a surface acoustic wave filter, which includes the surface acoustic wave resonator structure described in any one of the above embodiments.

In the embodiments of the present disclosure, a temperature compensation layer is disposed on the side of the interdigital transducer away from the piezoelectric substrate, and a protection layer is disposed between the temperature compensation layer and the interdigital transducer. The protection layer protects the interdigital transducers from being oxidized, for example, during the process of forming the temperature compensation layer, so as to avoid issues such as performance degradation of the resonator caused by the oxidation of the interdigital transducer.

In addition, through disposing a metal structure and a protection layer as a clutter suppression structure on the side of the interdigital transducer away from the piezoelectric substrate, or performing ion implantation on the piezoelectric substrate to form doped regions as a clutter suppression structure, the formation and/or propagation of clutter wave in the resonator can be suppressed, so as to avoid energy loss; on the other hand, for the case where an additional metal block disposed at the end and in the same layer of the interdigital transducer serves as a clutter suppression structure, in which the metal block in the same layer may have adverse effect on the interdigital electrodes, especially for medium or high frequency resonator devices, the finger width of the interdigital electrode is thin, which results in that the metal block at end of the interdigital electrode requires high alignment accuracy, and the relative phase shift of the metal block may be easily caused, and the clutter suppression performance of the resonator may be obviously reduced; while in the embodiments of the present application, the clutter suppression structure is not disposed at the same layer as the interdigital electrodes, but is disposed on the side of the interdigital electrodes away from the piezoelectric substrate or close to the piezoelectric substrate, as such, the forming processes of the interdigital electrodes and the clutter suppression structure can be relatively independent of each other without adversely affecting each other, and the formed clutter suppression structure can effectively suppress the formation and/or propagation of clutter wave, thereby improving the clutter suppression performance of the resonator, avoiding energy loss, and improving the device performance of the resonator.

In the embodiments where the clutter suppression structure includes the metal structure disposed on the side of the interdigital electrodes away from the piezoelectric substrate, the clutter suppression structure is embedded in the temperature compensation layer, and further includes a protection layer disposed between the metal structure and the temperature compensation layer, such that the protection layer protects the metal structure from being oxidized, for example, during the process of forming the temperature compensation sublayer, so as to avoid issues such as degradation of the clutter suppression performance of the resonator due to the oxidation of the metal structure. Therefore, in the embodiments of the present disclosure, through disposing the temperature compensation layer, the protection layer and the clutter suppression structure, the device performance of the surface acoustic resonator and the filter including the same can be effectively improved.

The following statements should be noted: (1) the accompanying drawings related to the embodiment(s) of the present disclosure involve only the structure(s) in connection with the embodiment(s) of the present disclosure, and other structure(s) can be referred to common design(s); (2) in case of no conflict, features in one embodiment or in different embodiments of the present disclosure can be combined.

The above, are only specific embodiments of the present disclosure, but the scope of protection of the present disclosure is not limited thereto, and any variation or substitution readily conceivable by any person skilled in the art within the technical scope disclosed in the present disclosure shall be covered by the scope of protection of the present disclosure. Accordingly, the scope of protection of the present disclosure shall be defined by the scope of protection of the claims.

The invention claimed is:

1. A surface acoustic wave resonator structure, comprising:
a piezoelectric substrate;
an interdigital transducer, comprising a first interdigital electrode structure and a second interdigital electrode structure, disposed side by side on the piezoelectric substrate, wherein the first interdigital electrode structure comprises first interdigital electrodes and a first interdigital electrode lead-out part connected to each other, the second interdigital electrode structure comprises second interdigital electrodes and a second interdigital electrode lead-out part connected to each other, the first interdigital electrodes and the second interdigital electrodes extend along a first direction and are alternately arranged in a second direction, the first direction and the second direction intersect with each other;
a temperature compensation layer, disposed on a side of the interdigital transducer away from the piezoelectric substrate; and
a first protection layer, disposed between the interdigital transducer and the temperature compensation layer, wherein the first protection layer is configured to protect the interdigital transducer from being oxidized; and
a clutter suppression structure, comprising a first clutter suppression layer and a second clutter suppression layer, each of which extends across the first interdigital electrodes and the second interdigital electrodes along the second direction, wherein the first clutter suppression layer and the second clutter suppression layer are arranged side by side in the first direction, and each of the first clutter suppression layer and the second clutter suppression layer is overlapped with the first interdigital electrodes and the second interdigital electrodes in a third direction perpendicular to a main surface of the piezoelectric substrate,
wherein the clutter suppression structure comprises a metal structure, and the metal structure is disposed on a side of the first interdigital electrodes and the second interdigital electrodes away from the piezoelectric substrate, and the metal structure comprises a first metal strip serving as the first clutter suppression layer and a second metal strip serving as the second clutter suppression layer;
wherein the metal structure is embedded in the temperature compensation layer, and the temperature compensation layer comprises: a first temperature compensation sublayer, disposed on a side of the first protection layer away from the first interdigital electrode structure and the second interdigital electrode structure, wherein the metal structure is disposed on a side of the first compensation sublayer away from the first protection layer; and a second temperature compensation sublayer, disposed on a side of the first temperature compensation sublayer and the metal structure away from the first protection layer; and
wherein the clutter suppression structure further comprises:
a second protection layer, disposed at least between the metal structure and the second temperature compensation sublayer to cover sidewalls of the metal structure and a surface of the metal structure at a side close to the second temperature compensation sublayer, wherein the second protection layer does not include an oxide, and the second protection layer is configured to protect the metal structure from being oxidized.

2. The surface acoustic wave resonator structure according to claim 1, wherein the first clutter suppression layer has an edge aligned with an edge of the second interdigital electrodes away from the second interdigital electrode lead-out part in the third direction, the second clutter suppression layer has an edge aligned with an edge of the first interdigital electrodes away from the first interdigital electrode lead-out part in the third direction.

3. The surface acoustic wave resonator structure according to claim 1, wherein the second protection layer is further disposed between the first temperature compensation sublayer and the second temperature compensation sublayer, and a sidewall of the second protection layer is aligned with sidewalls of the first temperature compensation sublayer and the second temperature compensation sublayer in a direction perpendicular to the main surface of the piezoelectric substrate.

4. A filter, comprising the surface acoustic wave resonator structure according to claim 1.

5. A surface acoustic wave resonator structure, comprising:
a piezoelectric substrate;
an interdigital transducer, comprising a first interdigital electrode structure and a second interdigital electrode structure, disposed side by side on the piezoelectric substrate, wherein the first interdigital electrode structure comprises first interdigital electrodes and a first interdigital electrode lead-out part connected to each other, the second interdigital electrode structure comprises second interdigital electrodes and a second interdigital electrode lead-out part connected to each other, the first interdigital electrodes and the second interdigital electrodes extend along a first direction and are alternately arranged in a second direction, the first direction and the second direction intersect with each other;
a temperature compensation layer, disposed on a side of the interdigital transducer away from the piezoelectric substrate; and
a first protection layer, disposed between the interdigital transducer and the temperature compensation layer, wherein the first protection layer is configured to protect the interdigital transducer from being oxidized; and
a clutter suppression structure, comprising a first clutter suppression layer and a second clutter suppression layer, each of which extends across the first interdigital electrodes and the second interdigital electrodes along the second direction, wherein the first clutter suppression layer and the second clutter suppression layer are arranged side by side in the first direction, and each of the first clutter suppression layer and the second clutter suppression layer is overlapped with the first interdigital electrodes and the second interdigital electrodes in a third direction perpendicular to a main surface of the piezoelectric substrate,
wherein the clutter suppression structure comprises a doped structure embedded in the piezoelectric substrate, and the doped structure comprises a first doped region serving as the first clutter suppression layer and a second doped region serving as the second clutter suppression layer,
wherein the doped structure comprises hydrogen ions or helium ions doped in the piezoelectric substrate.

6. The surface acoustic wave resonator structure according to claim 5, wherein the doped structure is in contact with portions of surfaces of the first interdigital electrodes and the second interdigital electrodes at a side close to the piezoelectric substrate.

7. The surface acoustic wave resonator structure of claim 5, wherein portions of the first protection layer are sandwiched between the temperature compensation layer and the doped structure.

8. The surface acoustic wave resonator structure according to claim 5, wherein surfaces of the first doped region and the second doped region at a side close to the interdigital transducer are level with the main surface of the piezoelectric substrate contacting the interdigital transducer.

9. A method of forming a surface acoustic wave resonator structure, comprising:
providing a piezoelectric substrate;
forming an interdigital transducer on the piezoelectric substrate, wherein the interdigital transducer comprises a first interdigital electrode structure and a second interdigital electrode structure disposed side by side on the piezoelectric substrate; the first interdigital electrode structure comprises first interdigital electrodes and a first interdigital electrode lead-out part connected to each other, and the second interdigital electrode structure comprises second interdigital electrodes and a second interdigital electrode lead-out part connected to each other, the first interdigital electrodes and the second interdigital electrodes extend along a first direction and are alternately arranged in a second direction, the first direction and the second direction intersect with each other;
forming a first protection layer on the interdigital transducer to cover sidewalls of the interdigital transducer and a surface of the interdigital transducer away from the piezoelectric substrate; and
forming a temperature compensation layer on the first protection layer and at a side of the interdigital transducer away from the piezoelectric substrate, wherein the first protection layer is located between the interdigital transducer and the temperature compensation layer, and configured to protect the interdigital transducer from being oxidized; and
forming a clutter suppression structure, wherein the clutter suppression structure comprises a first clutter suppression layer and a second clutter suppression layer, each of which extends across the first interdigital electrodes and the second interdigital electrodes along the second direction, wherein the first clutter suppression layer and the second clutter suppression layer are arranged side by side in the first direction, and each of the first clutter suppression layer and the second clutter suppression layer is overlapped with the first interdigital electrodes and the second interdigital electrodes in a third direction perpendicular to a main surface of the piezoelectric substrate,
wherein the clutter suppression structure comprises a metal structure, and the metal structure is disposed on a side of the first interdigital electrodes and the second interdigital electrodes away from the piezoelectric substrate, and the metal structure comprises a first metal strip serving as the first clutter suppression layer and a second metal strip serving as the second clutter suppression layer; wherein the metal structure is embedded in the temperature compensation layer, and the temperature compensation layer comprises: a first temperature compensation sublayer, disposed on a side of the first protection layer away from the first interdigital electrode structure and the second interdigital electrode structure, wherein the metal structure is disposed on a side of the first compensation sublayer away from the first protection layer; and a second temperature compensation sublayer, disposed on a side of the first temperature compensation sublayer and the metal structure away from the first protection layer; and wherein the clutter suppression structure further comprises: a second protection layer, disposed at least between the metal structure and the second temperature compensation sublayer to cover sidewalls of the metal structure and a surface of the metal structure at a side close to the second temperature compensation sublayer, wherein the second protection layer does not include an oxide, and the second protection layer is configured to protect the metal structure from being oxidized; or
wherein the clutter suppression structure comprises a doped structure embedded in the piezoelectric substrate, and the doped structure comprises a first doped region serving as the first clutter suppression layer and a second doped region serving as the second clutter suppression layer, wherein the doped structure comprises hydrogen ions or helium ions doped in the piezoelectric substrate.

10. The method of forming the surface acoustic wave resonator structure according to claim 9, wherein the first protection layer is configured to protect the interdigital transducer from being oxidized during a forming process of the temperature compensation layer.

11. The method of forming the surface acoustic wave resonator structure according to claim 9, wherein
a forming process of the temperature compensation layer comprises: forming a silicon oxide layer by a physical vapor deposition process, during which a silicon target is used, and oxygen is introduced into a deposition chamber, wherein the silicon oxide layer serves as the temperature compensation layer; and
during the forming process of the temperature compensation layer, the first protection layer isolates the interdigital transducer from oxygen in the deposition chamber, so as to prevent the interdigital transducer from being oxidized.

12. The method of forming the surface acoustic wave resonator structure according to claim 9,
wherein the second protection layer is formed on a side of the first temperature compensation sublayer and the metal structure away from the first protection layer before forming the second temperature compensation sublayer, and during a process of forming the second temperature compensation sublayer, the second protection layer isolates the metal structure from oxygen in a deposition chamber, so as to prevent the metal structure from being oxidized.

13. The method of forming the surface acoustic wave resonator structure according to claim 12, further comprising:
performing a patterning process on the second protection layer to remove a portion of the second protection layer covering the first temperature compensation sublayer, and remain a portion of the second protection layer covering the metal structure,
wherein after forming the second temperature compensation sublayer, a portion of the second temperature compensation sublayer is in contact with the first temperature compensation sublayer.

14. The method of forming the surface acoustic wave resonator structure according to claim 9, wherein forming the clutter suppression structure comprises:
  before forming the interdigital transducer, performing an ion implantation process on the piezoelectric substrate to form the doped structure in the piezoelectric substrate.

* * * * *